(12) United States Patent
Xuan et al.

(10) Patent No.: US 7,906,786 B2
(45) Date of Patent: Mar. 15, 2011

(54) LIGHT EMITTING DEVICE

(75) Inventors: Rong Xuan, Taipei County (TW);
Jeng-Dar Tsay, Kaohsiung (TW);
Chih-Hao Hsu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 34 days.

(21) Appl. No.: 12/117,747

(22) Filed: May 9, 2008

(65) Prior Publication Data

US 2009/0179209 A1     Jul. 16, 2009

Related U.S. Application Data

(60) Provisional application No. 61/020,397, filed on Jan. 11, 2008.

(51) Int. Cl.
*H01L 31/14* (2006.01)
(52) U.S. Cl. .................. 257/79; 257/100; 257/E33.059
(58) Field of Classification Search .................. 257/79, 257/98, 13, 425, E33.059, 99, 100; 438/29; 372/37; 250/552; 352/612
See application file for complete search history.

(56) References Cited

U.S. PATENT DOCUMENTS

| | | | |
|---|---|---|---|
| 4,450,460 A | | 5/1984 | Morimoto |
| 5,874,749 A | * | 2/1999 | Jonker ............................. 257/98 |
| 7,301,174 B1 | * | 11/2007 | Popovich ........................ 257/88 |
| 2005/0018725 A1 | * | 1/2005 | Nurmikko ....................... 372/37 |
| 2005/0207165 A1 | * | 9/2005 | Shimizu et al. ................ 362/362 |
| 2005/0221527 A1 | * | 10/2005 | Yeh et al. .......................... 438/46 |
| 2005/0238076 A1 | * | 10/2005 | Kuwata et al. ................ 372/50.1 |
| 2006/0186432 A1 | * | 8/2006 | Osipov et al. ................. 257/103 |
| 2006/0256825 A1 | * | 11/2006 | Matsumura et al. ........ 372/43.01 |

FOREIGN PATENT DOCUMENTS

JP     09-219564     8/1997

OTHER PUBLICATIONS

Sze, "Semiconductor Devices. Physics and Technology", 2002, John Willey & Sons, pp. 291-291.*
Denbaars, "Gallium- Nitride-Based Materials for Blue to Ultraviolet Optoelectronics Devices", 1997, Proceedings of IEEE, vol. 85, No. 11, pp. 1740-1749.*
Article titled "Two-Dimensional Quantum-Mechanical Confinement of Electrons in LED by Strong Magnetic Fields" authored by Arakawa et al., IEEE Transactions on Electron Devices, vol. ED-30, No. 4, Apr. 1983, pp. 330-334.
"1st Office Action of China Counterpart Application" issued May 11, 2010, p. 1-p. 6.

* cited by examiner

*Primary Examiner* — Thomas L Dickey
*Assistant Examiner* — Nikolay Yushin
(74) *Attorney, Agent, or Firm* — Jianq Chyun IP Office

(57) ABSTRACT

A light emitting device is provided. In the present invention, a magnetic material is added to the light emitting device to change the current path and the distribution of the current density. As the main distribution of the current density is moved from the area between the electrodes to the area under light-out plane, the emitted light is no longer blocked by the electrodes, such that the light emitting efficiency can be enhanced and the distribution of the current density remains homogeneous.

100 Claims, 28 Drawing Sheets

(a)

(b)

(a) 1300a (b) 1300b (c) 1300c

LIGHT EMITTING DEVICE

CROSS-REFERENCE TO RELATED APPLICATION

This application claims the priority benefit of U.S.A. provisional application Ser. No. 61/020,397, filed on Jan. 11, 2008. The entirety of the above-mentioned patent application is hereby incorporated by reference herein and made a part of this specification.

BACKGROUND OF THE INVENTION

1. Field of the Invention

The present invention is related to a light emitting device. More particularly, the present invention is related to a light emitting device applying an energy field.

2. Description of Related Art

Distinct from regular fluorescent lamps or incandescent lamps that generate heat to emit light, semiconductor light emitting devices such as light emitting diodes (LEDs) adopt the specific property of semiconductor to emit light, in which the light emitted by the light emitting devices is referred to as cold luminescence. The light emitting devices have advantages of long service life, light weight, and low power consumption, such that the light emitting devices have been employed in a wide variety of applications, such as optical displays, traffic lights, data storage apparatus, communication devices, illumination apparatus, and medical treatment equipment. Accordingly, how to improve the light emitting efficiency of light emitting devices is an important issue in this art.

FIG. 1 is a schematic diagram illustrating a cross-sectional view of a conventional light emitting device. Referring to FIG. 1, the light emitting device 100 is a vertical type light emitting diode (LED), which includes electrodes 110 and 120, a first doped layer 130, a second doped layer 140, and a semiconductor light emitting layer 150. The distribution of the current density is decreased gradually as the distance deviating from the electrodes 110 and 120 is increased. As shown in FIG. 1, the tight lines represent high current density, and the area with most number of lines is located between the electrodes 110 and 120. However, due to the congenital deficiency, the area with highest light emitting efficiency is blocked by the electrode 110, such that the overall light emitting efficiency of the light emitting device 100 is affected.

FIG. 2 is a schematic diagram illustrating a top view of a conventional light emitting device. Referring to FIG. 2, the light emitting device 200 is a horizontal type LED, which includes electrodes 210 and 220. Because the current always transmits through a path with lowest resistance, the distribution of the current density is inhomogeneous between the electrodes 210 and 220, where the main distribution of the current density is along the central path between the electrodes 210 and 220. Therefore, in order to increase the amount of light emitted by the light emitting device 200, the uniform current distribution area is needed to be enlarged, such that the size of the light emitting device 200 is enlarged.

Based on aforesaid description, it is concluded that the light emitting efficiency of the light emitting device may be influenced by the following factors.

1. The area between the electrodes of the light emitting device is not only the area with highest current carrier density, but also the area producing most photons. However, the photons produced between the electrodes are mostly blocked by the opaque electrode, such that the light emitting efficiency is hard to be enhanced.

2. The current always transmits through a path with lowest resistance, which results in inhomogeneous luminance of the light emitting device, such that the light emitting efficiency and the size of the light emitting device are also limited.

SUMMARY OF THE INVENTION

Accordingly, the present invention is directed to a light emitting device, wherein a magnetic material is coupled to a light emitting chip for exerting a magnetic field on the light emitting chip, so as to increase the brightness of the light emitting device.

The present invention provides a light emitting device, which includes at least one light emitting chip and a magnetic material. The magnetic material is coupled to the light emitting chip for exerting a magnetic field on the light emitting chip.

In one embodiment of the present invention, the light emitting chip comprises a substrate, a light emitting stacking layer, and a plurality of electrodes, wherein the substrate is coupled to the magnetic material, the light emitting stacking layer is disposed on the substrate, and the electrodes are electrically coupled to the light emitting stacking layer.

In one embodiment of the present invention, the light emitting stacking layer comprises a first doped layer, a second doped layer, and an active layer, wherein the second doped layer is disposed on the substrate and under the first doped layer, and the active layer is disposed between the first doped layer and the second doped layer. The first doped layer and the second doped layer comprise an P doped layer or an N doped layer.

In one embodiment of the present invention, the electrodes comprises a first electrode and a second electrode, wherein the first electrode is disposed on the first doped layer and electrically coupled to the first doped layer, and the second electrode is disposed under the second doped layer and electrically coupled to the second doped layer.

In one embodiment of the present invention, the light emitting stacking layer further comprises a transparent conductive layer (TCL), which is above the first doped layer.

In one embodiment of the present invention, the light emitting stacking layer further comprises a block layer, which is disposed between the first electrode and the first doped layer for blocking a part of the electrical connection between the first electrode and the first doped layer.

In one embodiment of the present invention, the light emitting stacking layer further comprises an isolating layer, which is disposed between the second doped layer and the magnetic material for isolating the second electrode from an area under the first electrode.

In one embodiment of the present invention, a roughness pattern, a trapezoid pattern, a round pattern or a photonic crystal layer is further fabricated on a top surface or a bottom surface of the first doped layer, the second doped layer, the first electrode, the second electrode, the substrate, or the magnetic material.

In one embodiment of the present invention, the light emitting stacking layer further comprises a mirror layer, which is disposed between the second doped layer and the substrate, between the substrate and the second electrode, or between the second electrode and the magnetic material for reflecting the light emitted from the active layer.

In one embodiment of the present invention, the electrodes comprises a first electrode and a second electrode, wherein the first electrode is disposed on the first doped layer and electrically coupled to the first doped layer, and the second electrode is disposed on a surface of the second doped layer uncovered by the active layer and electrically coupled to the second doped layer. The first doped layer and the second doped layer comprise an P doped layer or an N doped layer.

In one embodiment of the present invention, the light emitting chip comprises a light emitting stacking layer, a substrate, and a plurality of electrodes, wherein the light emitting stacking layer is coupled to the magnetic material, the substrate is disposed on the light emitting stacking layer, and the electrodes are electrically coupled to the light emitting stacking layer.

In one embodiment of the present invention, the light emitting chip comprises a light emitting stacking layer and a plurality of electrodes, wherein the light emitting stacking layer is disposed on the magnetic material and the electrodes are electrically coupled to the light emitting stacking layer.

In one embodiment of the present invention, the light emitting chip comprises a light emitting stacking layer and a plurality of electrodes, wherein the light emitting stacking layer is disposed under the magnetic material and the electrodes are electrically coupled to the light emitting stacking layer.

In one embodiment of the present invention, the light emitting stacking layer is fabricated in a transitive inverted pyramid (TIP) form.

In one embodiment of the present invention, the magnetic material has a concave for disposing the light emitting chips and the concave has a reflective surface for reflecting light emitted by the light emitting chips.

In one embodiment of the present invention, the magnetic material exerts a magnetic field on the light emitting chip to change the distribution of current density of the light emitting chip so as to increase the brightness of the light emitting chip.

The present invention provides a light emitting device, which includes a light emitting stacking layer, a magnetic material, a first electrode, and a second electrode, wherein the light emitting stacking layer comprises a first surface and a second surface, the magnetic material is coupled to the second surface of the light stacking layer for exerting a magnetic field on the light emitting stacking layer, the first electrode is electrically coupled to the first surface of the light emitting stacking layer, and the second electrode is coupled to the magnetic material.

In one embodiment of the present invention, the light emitting device further comprises a substrate, which is disposed between the light emitting stacking layer and the magnetic material.

DESCRIPTION OF EMBODIMENTS

If a current flows through a conductor in a magnetic field, the magnetic field exerts a transverse force on the moving charge carriers which tends to push them to one side of the conductor. This is most evident in a thin flat conductor. A buildup of charge at the sides of the conductors will balance this magnetic influence, producing a measurable voltage between the two sides of the conductor. The presence of this measurable transverse voltage is called Hall Effect.

The present invention takes advantages of the Hall Effect and conducts an energy field on optoelectronic semiconductor devices. The externally added energy force will change the direction and path of the current flowing between the electrodes of the semiconductor device, so as to enhance the light emitting efficiency and current homogeneity of the light emitting device. Embodiments are given below for describing the detailed structure and current path of the light emitting device.

Figure 1:
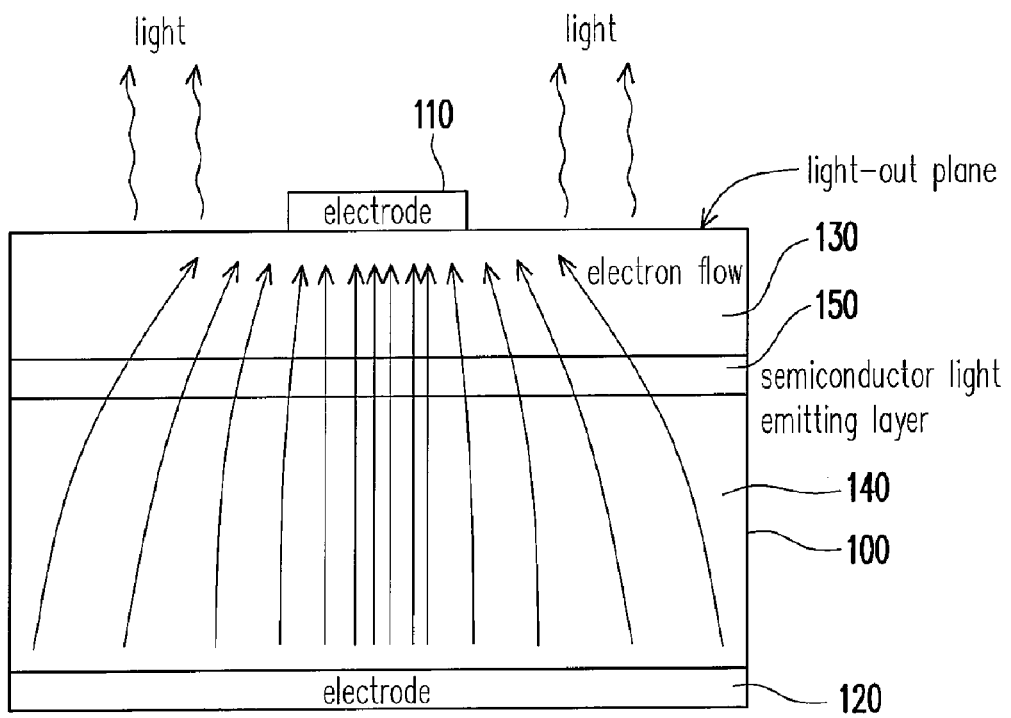
FIG. 1 is a schematic diagram illustrating a cross-sectional view of a conventional vertical light emitting device.
Figure 2:
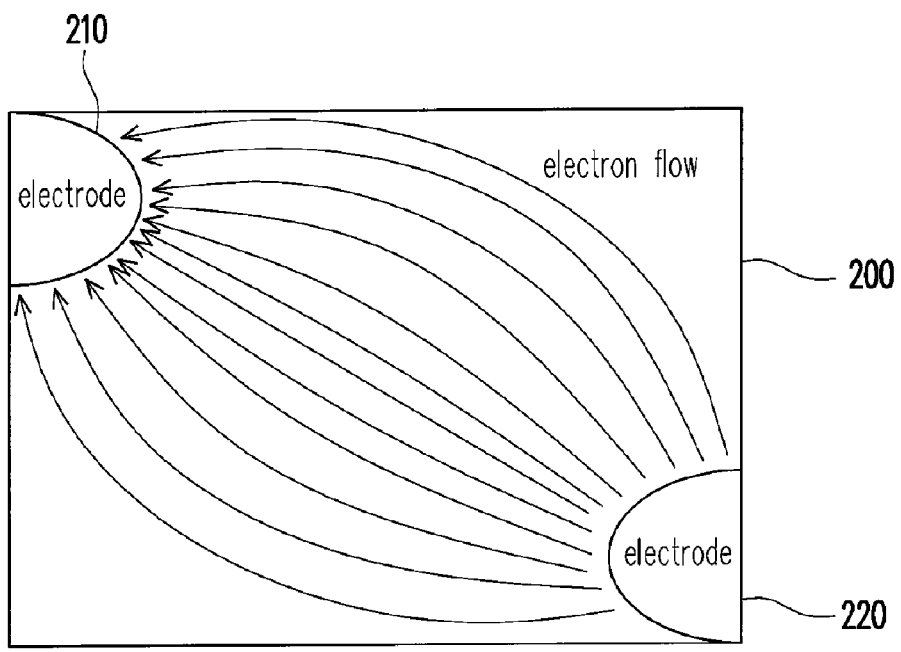
FIG. 2 is a schematic diagram illustrating a top view of a conventional horizontal light emitting device.
Figure 3:
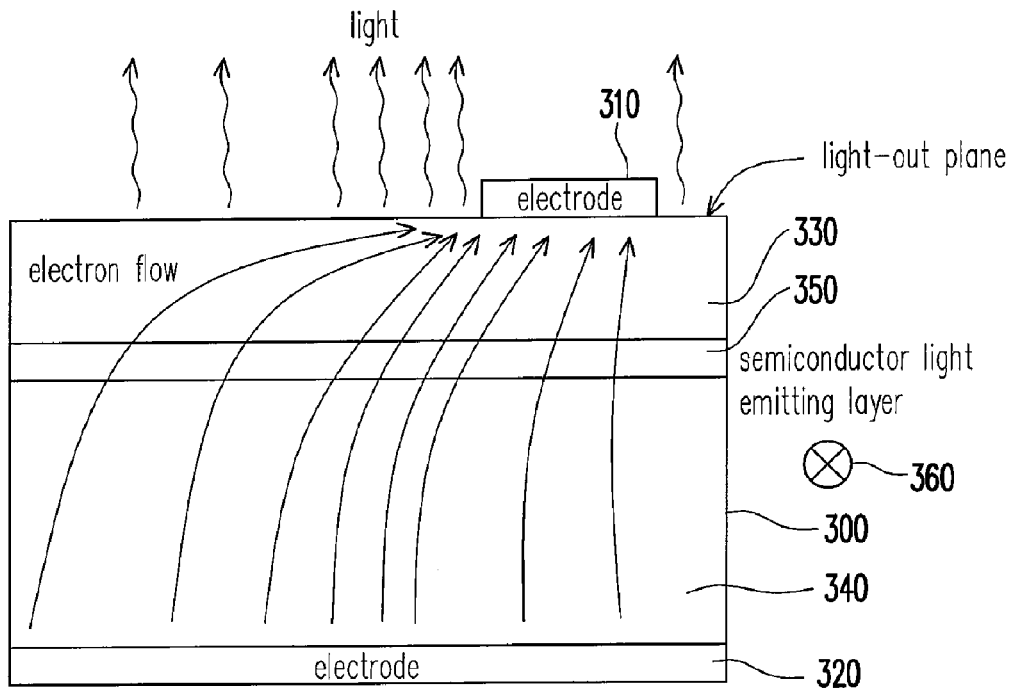
FIG. 3(a)~3(b) are schematic diagrams illustrating a cross-sectional view of a light emitting device according to one embodiment of the present invention.
Figure 3:
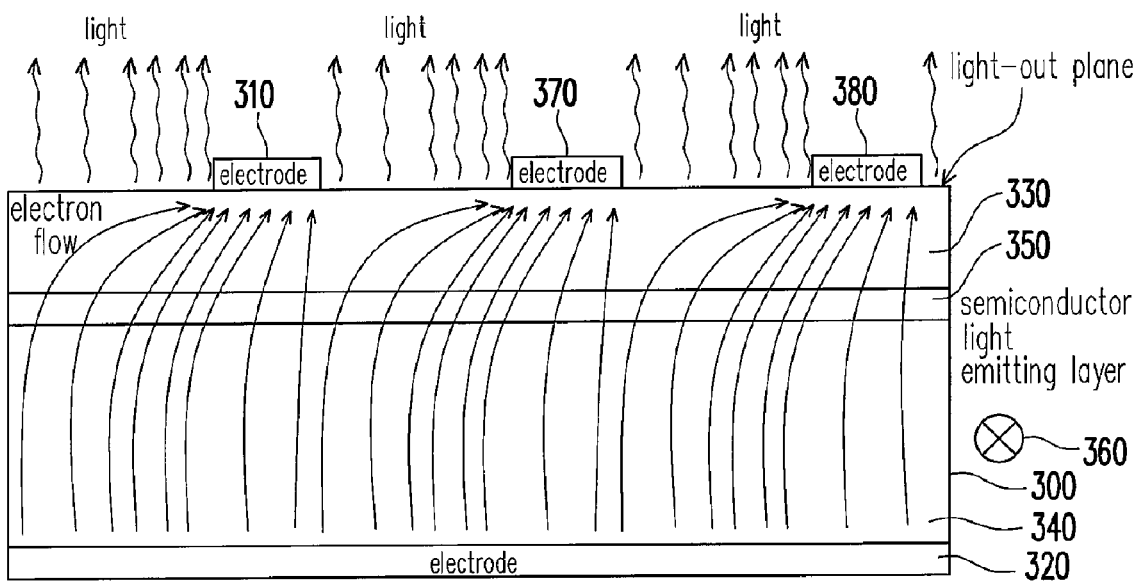

FIG. 3(a) and FIG. 3(b) are schematic diagrams illustrating a cross-sectional view of a light emitting device according to one embodiment of the present invention. Referring to FIG. 3(a), the light emitting device 300 is a vertical type LED, which includes electrodes 310 and 320, a first doped layer 330, a second doped layer 340, and a semiconductor light emitting layer 350, in which the first doped layer 330 and the second doped layer 340 may be an P doped layer or an N doped layer. The light emitting device 300 is covered by a magnetic field 360, which is produced by a magnetic source and directed inward the cross-sectional plane of the light emitting device 300. The Lorenz's force induced by the magnetic field pushes the electrons so as to make the current drift to the left. As shown in FIG. 3(a), the main distribution of the current density (represented by current lines) is moved from an area between the electrodes 310 and 320 to an area under the light-out plane, which means the area having the highest light emitting efficiency is no longer blocked by the electrode 310 and an overall light emitting efficiency of the light emitting device 300 can be substantially enhanced. The light-out plane as described above and hereinafter is defined as a surface of the first doped layer 330 uncovered by the electrodes. It should be emphasize herein that as long as a weight of the magnetic field is perpendicular to the flowing direction of the internal current in the light emitting device 300, an electric force is induced to drift the current and the light emitting efficiency can be enhanced.

Referring to FIG. 3(b), the light-out plane of the light emitting device 300 is expanded and disposed with plural electrodes 310, 370, and 380 thereon. As shown in FIG. 3(b), the distribution of the current density (represented by current lines) between the electrode 320 and each of the electrodes 310, 370, and 380 are all moved from the area between the electrodes to the area under the light-out plane, such that an overall light emitting efficiency of the light emitting device 300 is substantially enhanced. Moreover, the distributions of the current density under the light-out plane between two electrodes 310 and 370 and two electrodes 370 and 380 are the same. Therefore, the light emitting device 300 of the present invention is able to provide higher luminance without affecting the homogeneity of light.

Figure 4:
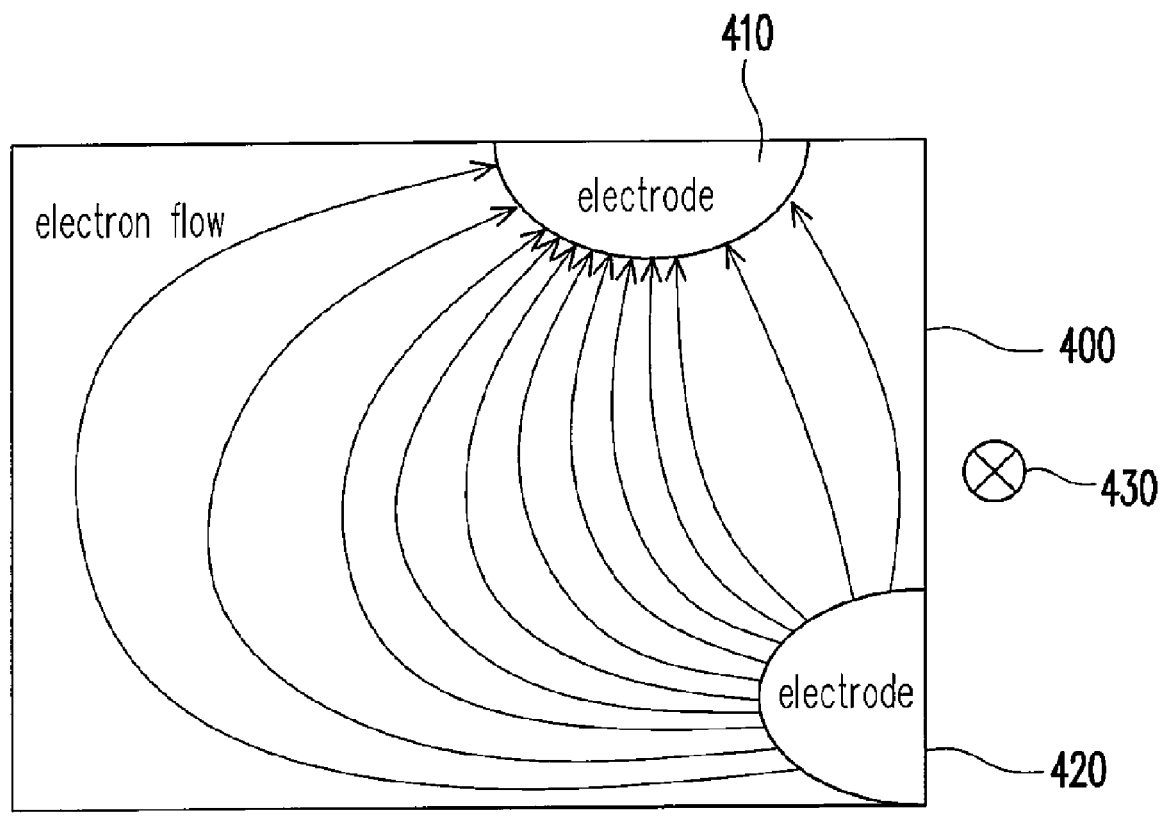
FIG. 4 is a top view of a light emitting device according to another embodiment of the present invention.

In another embodiment, FIG. 4 is a top view of a light emitting device according to another embodiment of the present invention. Referring to FIG. 4, the light emitting device 400 is a horizontal type LED, which includes electrodes 410 and 420. Similar to the forgoing embodiment, as the magnetic force pushes the electrons out of the paths between the electrodes 410 and 420, the distribution of current density is moved to the left part of the light emitting device 400. As shown in FIG. 4, the current path is spread to a larger area (left area), which creates a more homogeneous distribution of the current density.

As for the capability for spreading drift current, the related principle is derived below for illustrating how the external magnetic filed affects the current density.

In physics, the Lorentz force is the force exerted on a charged particle in an electromagnetic field. The particle will experience a force due to an electric field of qE, and due to the magnetic field $q \cdot \vec{v} \times \vec{B}$. The force F induced by the magnetic field B can be calculated by the following Lorentz force equation:

$$F = -q\left(\vec{E} + \frac{1}{c}\vec{v} \times \vec{B}\right), \vec{B} = B_x + B_y + B_z,$$

$$\vec{v} = v_x + v_y + v_z, \vec{E} = E_x + E_y + E_z,$$

where F is the Lorentz force, E is the electric field, B is the magnetic field, q is the electric charge of the particle, v is the instantaneous velocity of the electrons, and x is the cross product. Electrons will be accelerated in the same linear orientation as the electric field E, but will curve perpendicularly to both the instantaneous velocity vector v and the magnetic field B according to the right-hand rule.

In a static electric field, the time derivative are zero, so that the drift velocity is as follows:

$$v_x = -\frac{e\tau}{m}\left(E_x + \frac{B_z}{c}V_y - \frac{B_y}{c}V_z\right),$$

$$v_y = -\frac{e\tau}{m}\left(E_y - \frac{B_z}{c}V_x - \frac{B_y}{c}V_z\right),$$

$$v_z = -\frac{e\tau}{m}\left(E_z - \frac{B_y}{c}V_x - \frac{B_x}{c}V_y\right),$$

where m is the effective mass of an electron.

Based on the forgoing equations, it is concluded that the electrons are drifted in a helical path with an angular velocity $$w_c = \frac{eB}{mc}$$

along the axis of the static magnetic field B. For example, to spread the drift current to a negative x axis direction, the weight of the magnetic field in the z axis ($B_z$) needs to be increased and the weight of the magnetic field in the y axis ($B_y$) needs to be reduced. In addition, when the velocity of the external current in the y axis direction is increased, the velocity of the current in the x axis direction is also increased, such that the current homogeneity may be enhanced. It should be emphasized herein that as long as a weight of the magnetic field is perpendicular to the flowing direction of the internal current in the LED, an electromagnetic force is induced to drift the current and the light emitting efficiency can be enhanced. The same idea may also be applied to other light emitting devices such as laser diode (LD), which is not limited to it.

With the external magnetic field applied to the light emitting device, not only the current path is changed, but also the homogeneity of the carrier density in the semiconductor is altered. Accordingly, the light emitting device has a higher efficiency for optoelectronic transformation even though the amount of injected current remains unchanged.

It should be noted herein that the strength of the external magnetic field applied to the light emitting device of the present invention is larger than 0.01 Tesla and may be a constant value, a time-varying value, or a gradient-varying value, but is not limited to them. In addition, the angle between the direction of the magnetic field and the light emitting direction is from 0 to 360. Moreover, the magnetic field may be provided by a magnet, magnetic thin film, an electromagnet, or any other kind of magnetic material and the number of the magnetic source can be more than one.

Based on the forgoing conclusion, in an actual application, the light emitting devices can be combined with magnetic material through various manners such as epoxy, metal bonding, wafer bonding, epitaxy embedding and coating. In addition, the magnetic material may be coupled to the light emitting device itself and produced as a substrate, a submount, an electromagnet, a slug, a holder, or a magnetic heat sink or produced as a magnetic film or a magnetic bulk, so as to provide the magnetic field for the light emitting device. The magnetic material may be ferromagnetic material such as Rb, Ru, Nd, Fe, Pg, Co, Ni, Mn, Cr, Cu, Cr2, Pt, Sm, Sb, Pt, or an alloy thereof. The magnetic material may also be ceramic material such as oxides of Mn, Fe, Co, Cu and V, $Cr_2O_3$, CrS, MnS, MnSe, MnTe, fluorides of Mn, Fe, Co or Ni, chlorides of V, Cr, Fe, Co, Ni and Cu, bromides of Cu, CrSb, MnAs, MnBi, α-Mn, $MnCl_2.4H_2O$, $MnBr_2 . 4H_2O$, $CuCl_2.2H_2O$, $Co(NH_4)x(SO_4)xCl_2.6H_2O$, $FeCo_3$, and $FeCo_3.2MgCO_3$. The light emitting device can be an organic LED (OLED), an inorganic LED, a vertical type LED, a horizontal type LED, a thin film LED, or a flip chip LED. Embodiments of the light emitting device adopting foregoing structures are described respectively below.

Figure 5:
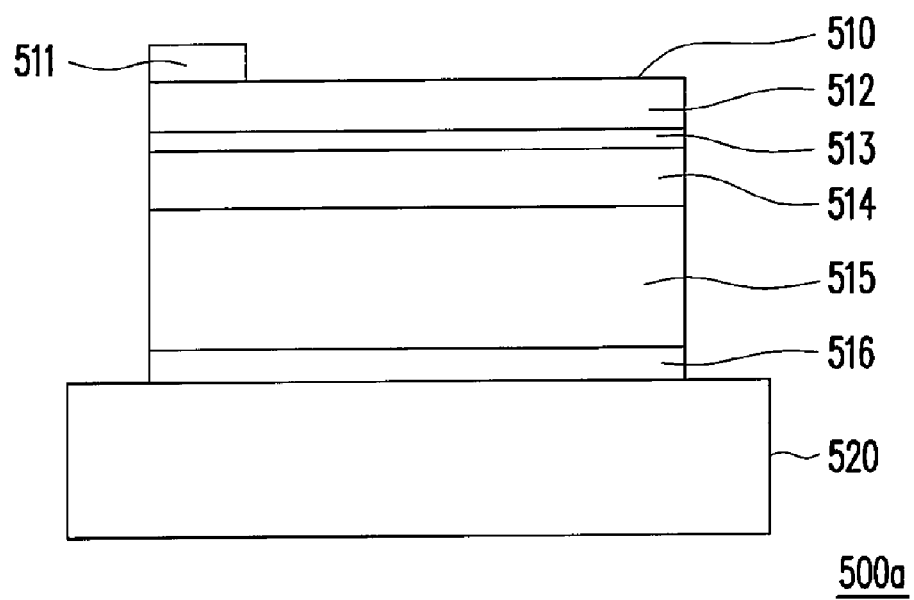
FIG. 5 is a cross-sectional diagram illustrating a structure of a light emitting device according to one embodiment of the present invention.

As for a standard LED having a vertical type structure, FIG. 5 is a cross-sectional diagram illustrating a structure of a light emitting device according to one embodiment of the present invention. Referring to FIG. 5, the light emitting device 500a of the present embodiment is a vertical type LED, which includes a light emitting chip 510 and a magnetic submount 520. The light emitting chip 510 is disposed on the magnetic submount 520 through an epoxy, a metal bonding, a wafer bonding, epitaxy embedding, or a coating process.

The light emitting chip 510 includes, from top to bottom, a first electrode 511, a first doped layer 512, an active layer 513, a second doped layer 514, a substrate 515, and a second electrode 516, in which the first doped layer 512, the active layer 513, and the second doped layer 514 form a light emitting stacking layer, which is disposed on the substrate 515. The first electrode 511 is disposed on the first doped layer 512 and electrically coupled to the first doped layer 512, and the second electrode 516 is disposed under the substrate 515 and electrically coupled to the second doped layer 514, so as to form a vertical type LED structure. The active layer 513 is disposed between first electrode 511 and the second electrode 516, and capable of generating light when a current flows through it. It should noted herein that the material of the substrate 515 may be Si, SiC, GaN, GaN, GaP, GaAs, sapphire, ZnO, or AlN, and the material of the light emitting stacking layer may be inorganic semiconductor material such as GaAs, InP, GaN, GaP, AlP, AlAs, InAs, GaSb, InSb, CdS, CdSe, ZnS, or ZnSe, or organic semiconductor material such as polymer.

The magnetic field induced by the magnetic submount 520 is exerted on the light emitting chip 510, such that the main distribution of current density in the light emitting chip 510 is moved from an area between the first electrode 511 and the second electrode 516 to an area under the light-out plane, so as to enhance the current homogeneity and increase an overall brightness of the light emitting device 500a.

Figure 6:
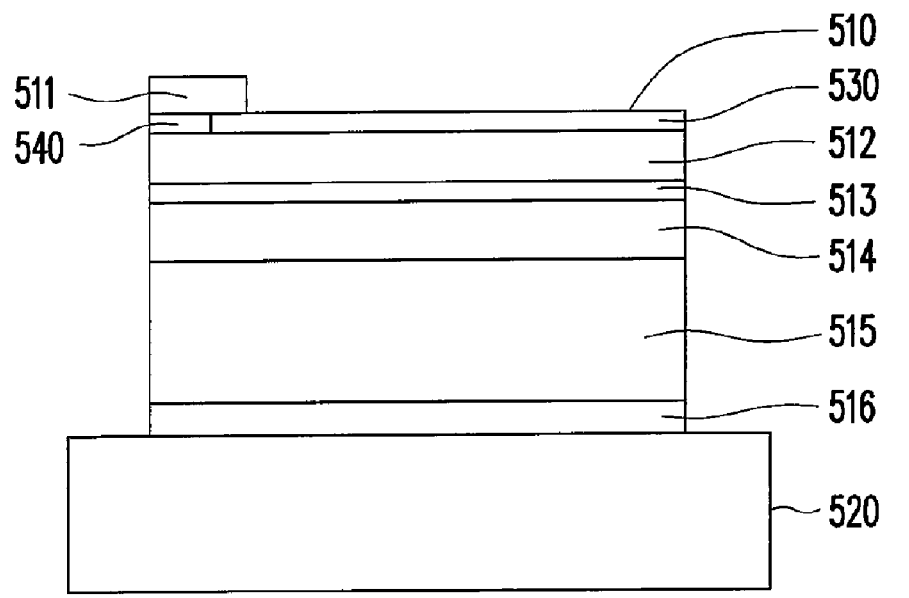
FIG. 6 is a cross-sectional diagram illustrating a structure of a light emitting device according to one embodiment of the present invention.

In one embodiment of the present invention, a transparent conductive layer (TCL) and a block layer are further disposed in the light emitting device to enhance the brightness thereof. FIG. 6 is a cross-sectional diagram illustrating a structure of a light emitting device according to one embodiment of the present invention. Referring to FIG. 6, in the light emitting device 500b of the present embodiment, a transparent conductive layer 530 is further disposed between the first electrode 511 and the first doped layer 512 as described in the previous embodiment, so as to enhance the effect of current crowding. The transparent conductive layer 530 is a thin film, which is conductive, transparent, and produced by materials such as Indium Tin Oxides (ITO), NiAu, and AlZnO.

Moreover, a block layer 540 is also disposed between the first electrode 511 and the first doped layer 512 for blocking a part of the electrical connection between the first electrode 511 and the first doped layer 512. Accordingly, the block layer 540 blocks most current paths under the first electrode 511 and only leaves a small gap for the current to flow out, such that the main distribution of current density is moved from an area under the first electrode 511 to an area under the light-out plane, thus increasing the brightness of the light emitting device 500b.

Figure 7:
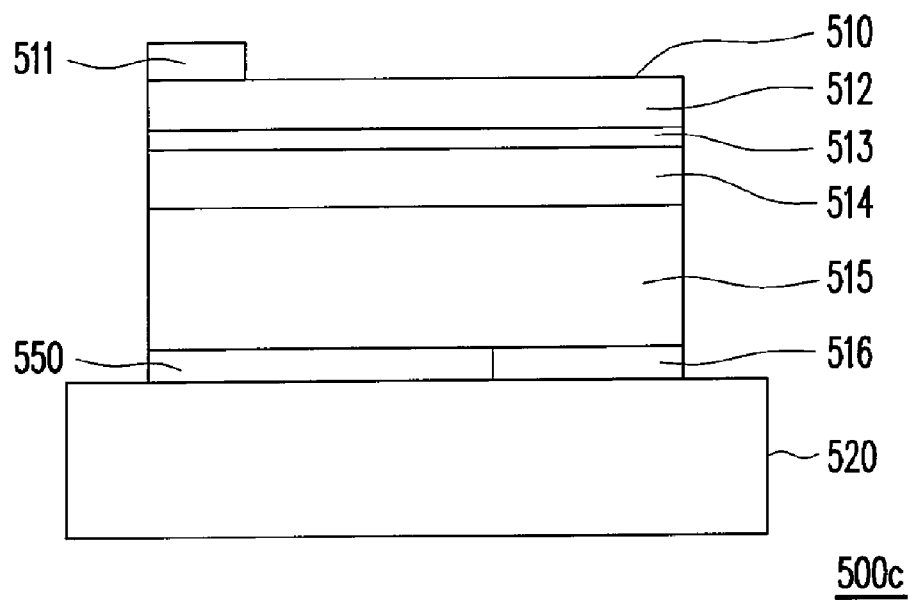
FIG. 7 is a cross-sectional diagram illustrating a structure of a light emitting device according to one embodiment of the present invention.

In one embodiment of the present invention, an isolating layer is further disposed in the light emitting device to enhance the brightness thereof. FIG. 7 is a cross-sectional diagram illustrating a structure of a light emitting device according to one embodiment of the present invention. Referring to FIG. 7, in the light emitting device 500c of the present embodiment, an isolating layer 550 is further disposed between the substrate 515 and the magnetic submount 520 as described in the previous embodiment. Similar to the effect of block layer 540, the isolating layer 550 blocks most current paths under the first electrode 511 and forces the main distribution of current density out of an area under the first electrode 511 to an area under the light-out plane, thus increasing the brightness of the light emitting device 500c.

Figure 8:
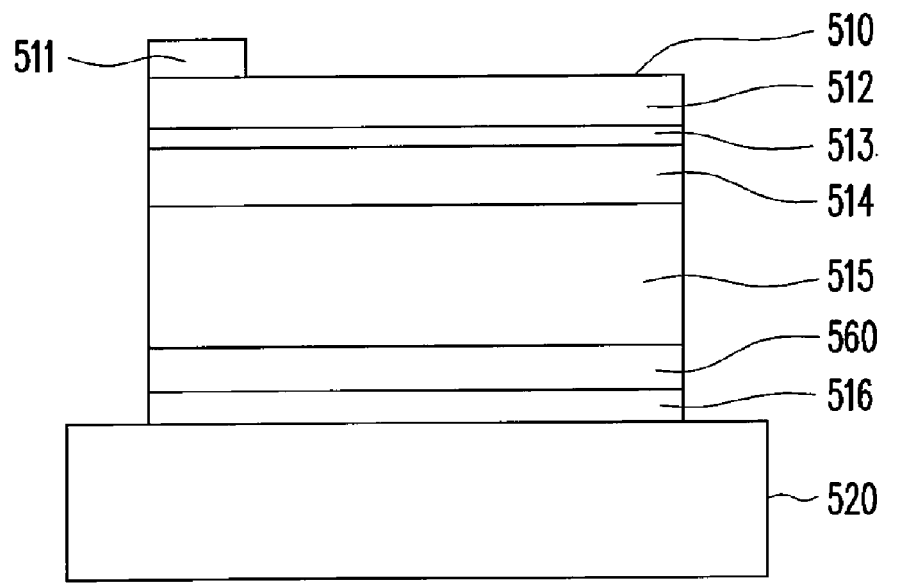
FIG. 8 is a cross-sectional diagram illustrating a structure of a light emitting device according to one embodiment of the present invention.

In one embodiment of the present invention, a mirror layer is further disposed in the light emitting device to enhance the brightness thereof. FIG. 8 is a cross-sectional diagram illustrating a structure of a light emitting device according to one embodiment of the present invention. Referring to FIG. 8, in the light emitting device 500d of the present embodiment, a mirror layer 560 is further disposed between the substrate 515 and the second electrode 516 for reflecting the light emitted from the active layer 513, so as to increase the brightness of the light emitting device. It should be noted herein that, in other embodiments, the mirror layer 560 may also be disposed between second doped layer 514 and the substrate 515 or between the second electrode 516 and the magnetic submount 520 for reflecting light, but not limited to them.

Figure 9:
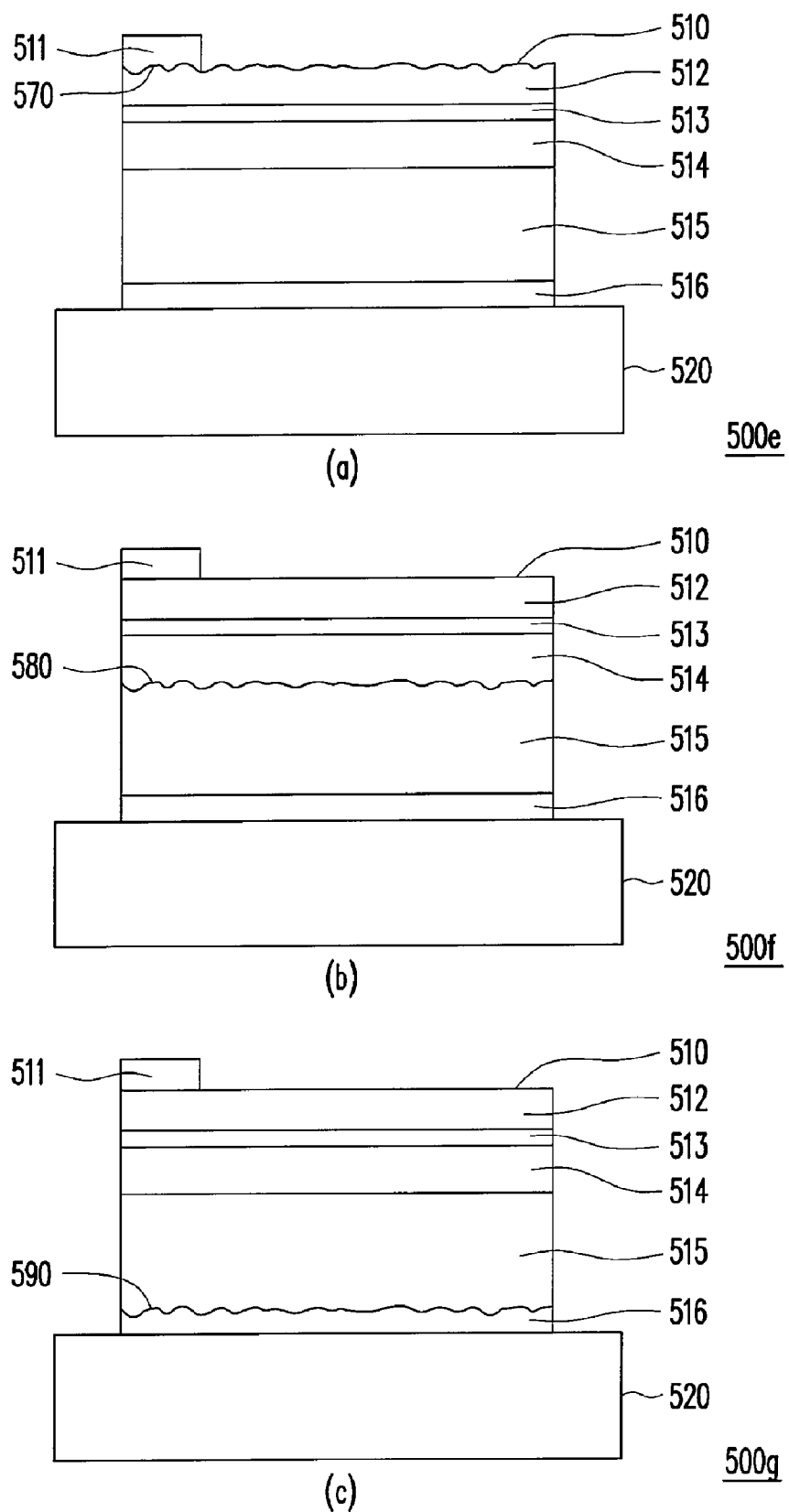
FIG. 9(a)~9(c) are cross-sectional diagrams illustrating a structure of a light emitting device according to one embodiment of the present invention.

In one embodiment of the present invention, a roughness pattern, a trapezoid pattern, a round pattern, or a photonic crystal layer is further fabricated to enhance the brightness of the light emitting device. FIG. 9(a)~9(c) are cross-sectional diagrams illustrating a structure of a light emitting device according to one embodiment of the present invention. Referring to FIG. 9(a), in the light emitting device 500e of the present embodiment, a roughness pattern 570 is fabricated on a top surface of the first doped layer 512 to increase the surface reflectivity of the first doped layer 512. Moreover, the roughness pattern may be fabricated on the top surface of the substrate 515 (or the bottom surface of the second doped layer 514) to increase the surface reflectivity of the substrate 515 (roughness pattern 580, as shown in FIG. 9(b)), or fabricated on the top surface of the second electrode 516 (or the bottom surface of the substrate 515) to increase the surface reflectivity of the second electrode 516 (roughness pattern 590, as shown in FIG. 9(c)). It should be noted herein that the roughness pattern as described above, a trapezoid pattern, a round pattern, or a photonic crystal layer may be fabricated on one or a plurality of the top surfaces and the bottom surfaces of the first doped layer 512, the second doped layer 514, the first electrode 511, the second electrode 516, the substrate 515, the magnetic submount 520, and the combination thereof, which is not limited to them.

Figure 10:
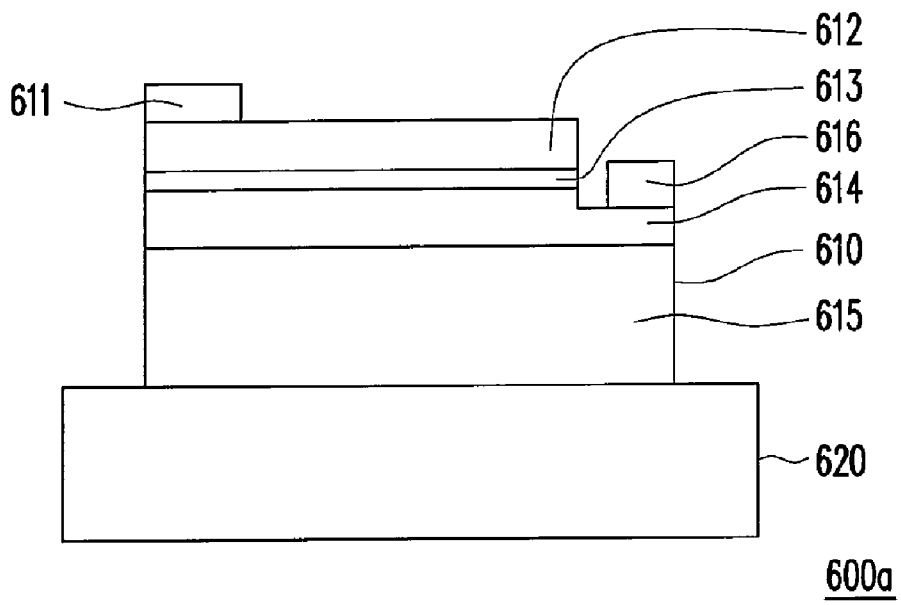
FIG. 10 is a cross-sectional diagram illustrating a structure of a light emitting device according to one embodiment of the present invention.

As for a standard LED having a horizontal type structure, FIG. 10 is a cross-sectional diagram illustrating a structure of a light emitting device according to one embodiment of the present invention. Referring to FIG. 10, the light emitting device 600a of the present embodiment is a horizontal type LED, which includes a light emitting chip 610 and a magnetic submount 620. The light emitting chip 610 is disposed on the magnetic submount 620 through an epoxy, a metal bonding, a wafer bonding, epitaxy embedding, or a coating process.

The light emitting chip 610 includes, from top to bottom, a first electrode 611, a first doped layer 612, an active layer 613, a second doped layer 614, and a substrate 615, in which the first doped layer 612, the active layer 613, and the second doped layer 614 form a light emitting stacking layer, which is disposed on the substrate 615. The first electrode 611 is disposed on the first doped layer 612 and electrically coupled to the first doped layer 612, and the second electrode 616 is disposed on a surface of the second doped layer 614 uncovered by the active layer 613 and electrically coupled to the second doped layer 614, so as to form a horizontal type LED structure. The active layer 613 is disposed between first electrode 611 and the second electrode 616, and capable of generating light when a current flows through it.

The magnetic field induced by the magnetic submount 620 is exerted on the light emitting chip 610, such that the main distribution of current density in the light emitting chip 610 is moved from an area under the electrodes 611 to an area under the light-out plane, so as to increase enhance the current homogeneity and an overall brightness of the light emitting device 600a.

Figure 11:
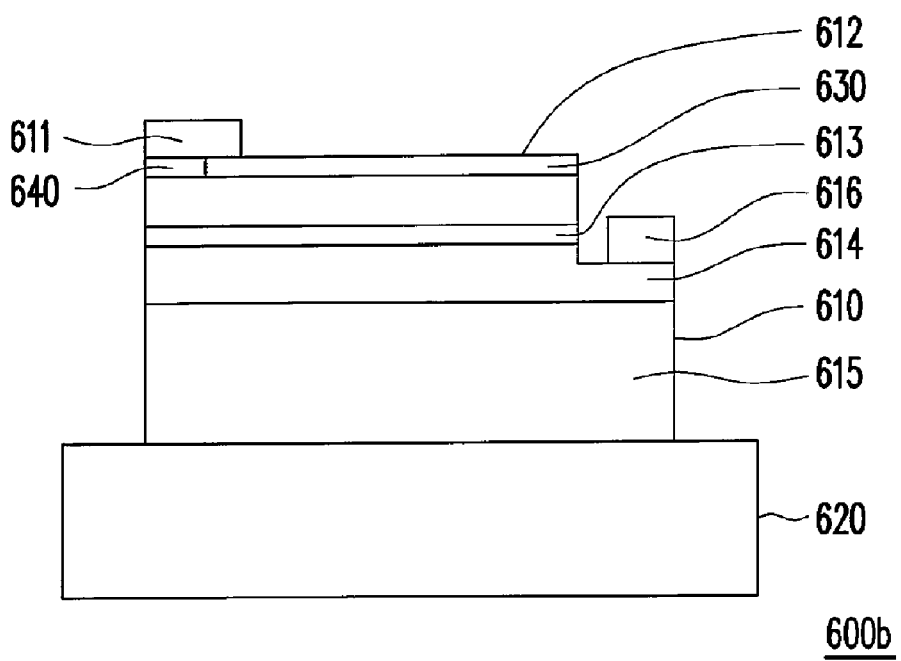
FIG. 11 is a cross-sectional diagram illustrating a structure of a light emitting device according to one embodiment of the present invention.

In one embodiment of the present invention, a transparent conductive layer and a block layer are further disposed in the light emitting device to enhance the brightness thereof FIG. 11 is a cross-sectional diagram illustrating a structure of a light emitting device according to one embodiment of the present invention. Referring to FIG. 11, in the light emitting device 600b of the present embodiment, a transparent conductive layer 630 is further disposed above the first doped layer 612 as described in the previous embodiment, so as to enhance the effect of current crowding. Moreover, a block layer 640 is also disposed between the first electrode 611 and the first doped layer 612 for blocking a part of the electrical connection between the first electrode 611 and the first doped layer 612. Accordingly, the block layer 640 blocks most current paths under the first electrode 611 and only leaves a small gap for the current to flow out, such that the main distribution of current density is moved from an area under the first electrode 611 to an area under the light-out plane, thus increasing the brightness of the light emitting device 600b.

Figure 12:
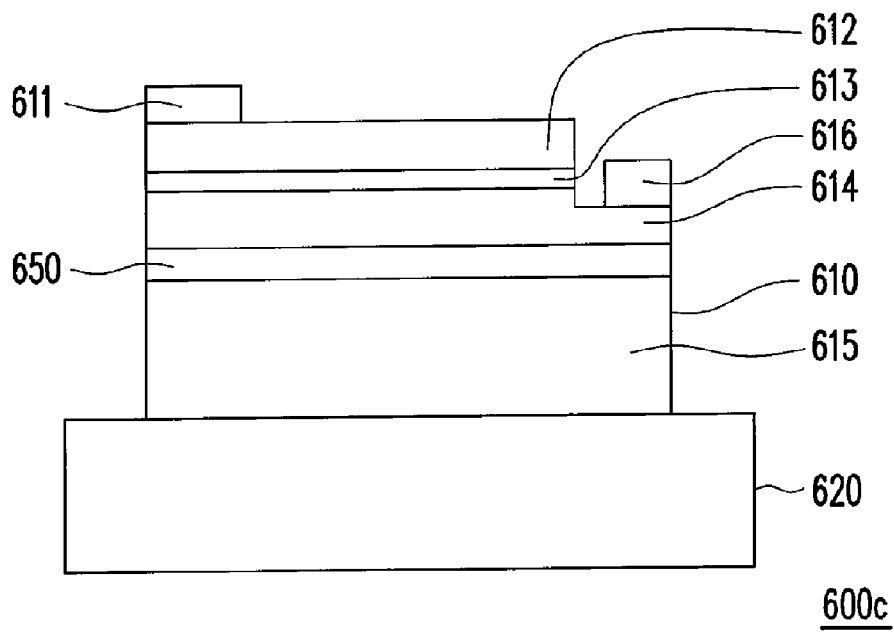
FIG. 12 is a cross-sectional diagram illustrating a structure of a light emitting device according to one embodiment of the present invention.

In one embodiment of the present invention, an isolating layer is further disposed in the light emitting device to enhance the brightness thereof. FIG. 12 is a cross-sectional diagram illustrating a structure of a light emitting device according to one embodiment of the present invention. Referring to FIG. 12, in the light emitting device 600c of the present embodiment, an isolating layer 650 is further disposed between the second doped layer 614 and the substrate 615 as described in the previous embodiment. Similar to the effect of block layer 640, the isolating layer 650 blocks most current paths between the second doped layer 614 and the substrate 615, such that the main distribution of current density is moved to an area under the light-out plane, thus increasing the brightness of the light emitting device 600c.

Figure 13:
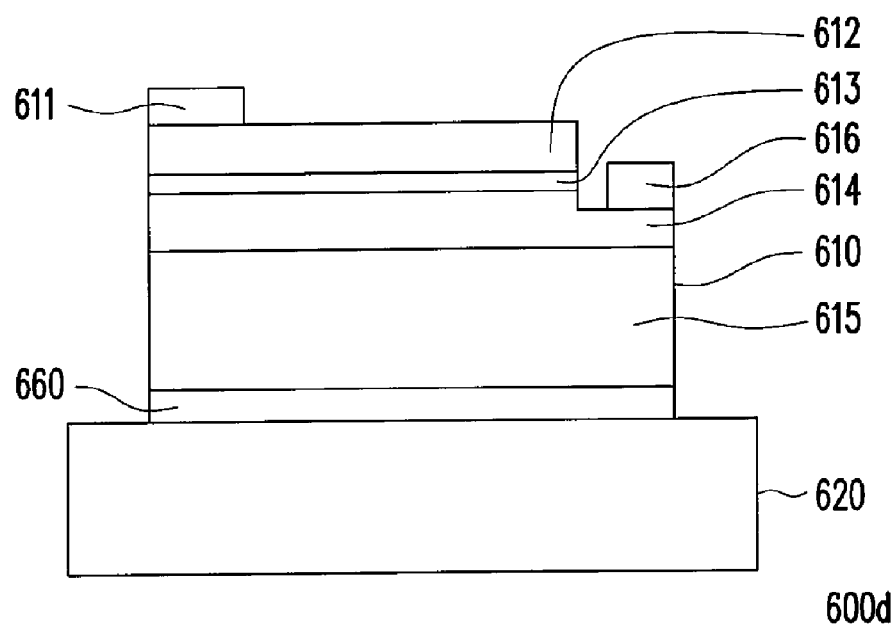
FIG. 13 is a cross-sectional diagram illustrating a structure of a light emitting device according to one embodiment of the present invention.

In one embodiment of the present invention, a mirror layer is further disposed in the light emitting device to enhance the brightness thereof. FIG. 13 is a cross-sectional diagram illustrating a structure of a light emitting device according to one embodiment of the present invention. Referring to FIG. 13, in the light emitting device 600d of the present embodiment, a mirror layer 660 is further disposed between the substrate 615 and the magnetic submount 620 for reflecting the light emitted from the active layer 613, so as to increase the brightness of the light emitting device 600d. It should be noted herein that, in other embodiments, the mirror layer 660 may also be disposed between second doped layer 614 and the substrate 615 for reflecting light, but not limited to them.

Figure 14:
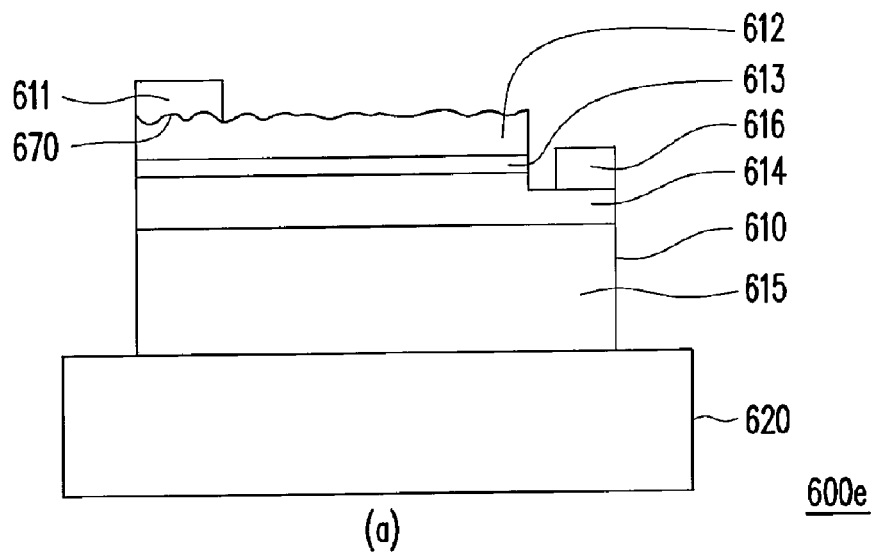
FIG. 14(a)~14(c) are cross-sectional diagrams illustrating a structure of a light emitting device according to one embodiment of the present invention.
Figure 14:
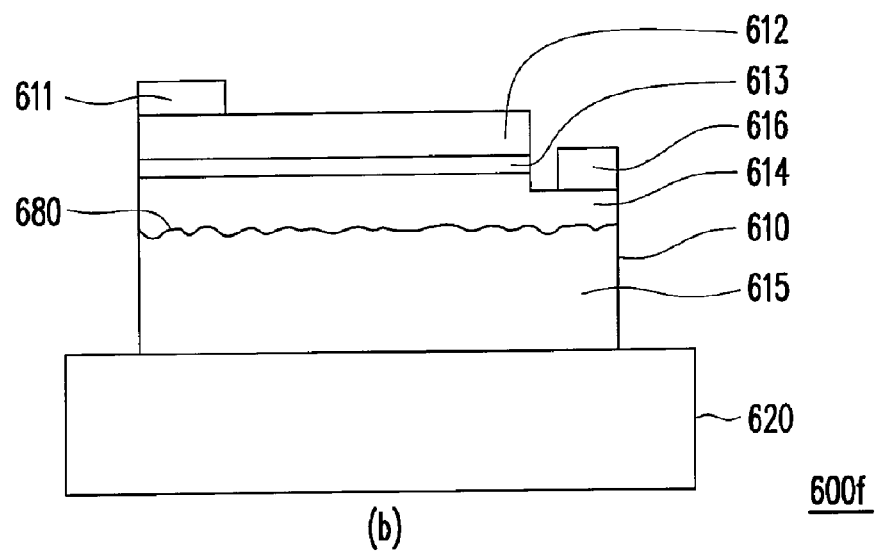
Figure 14:
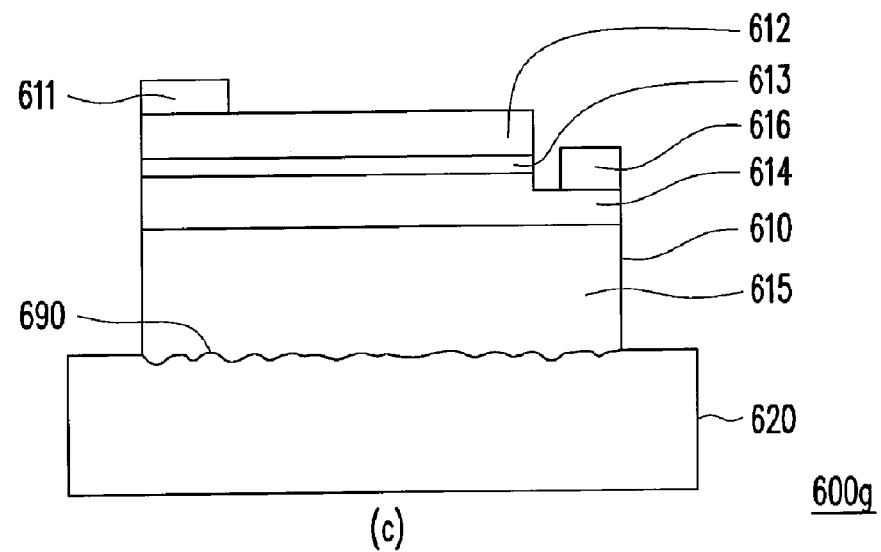

In one embodiment of the present invention, a roughness pattern, a trapezoid pattern, a round pattern, or a photonic crystal layer is further fabricated to enhance the brightness of the light emitting device. FIG. 14(a)~14(c) are cross-sectional diagrams illustrating a structure of a light emitting device according to one embodiment of the present invention. Referring to FIG. 14(a), in the light emitting device 600e of the present embodiment, a roughness pattern 670 is fabricated on a top surface of the first doped layer 612 to increase the surface reflectivity of the first doped layer 612. Moreover, the roughness pattern may be fabricated on the top surface of the substrate 615 (or the bottom surface of the second doped layer 614) to increase the surface reflectivity of the substrate 615 (roughness pattern 680, as shown in FIG. 14(b)), or fabricated on the top surface of the magnetic submount 620 (or the bottom surface of the substrate 615) to increase the surface reflectivity of the magnetic submount 620 (roughness pattern 690, as shown in FIG. 14(c)). It should be noted herein that the roughness pattern as described above, a trapezoid pattern, a round pattern, or a photonic crystal layer may be fabricated on one or a plurality of the top surfaces and the bottom surfaces of the first doped layer 612, the second doped layer 614, the first electrode 611, the substrate 615, the magnetic submount 620, and the combination thereof, which is not limited to them.

Figure 15:
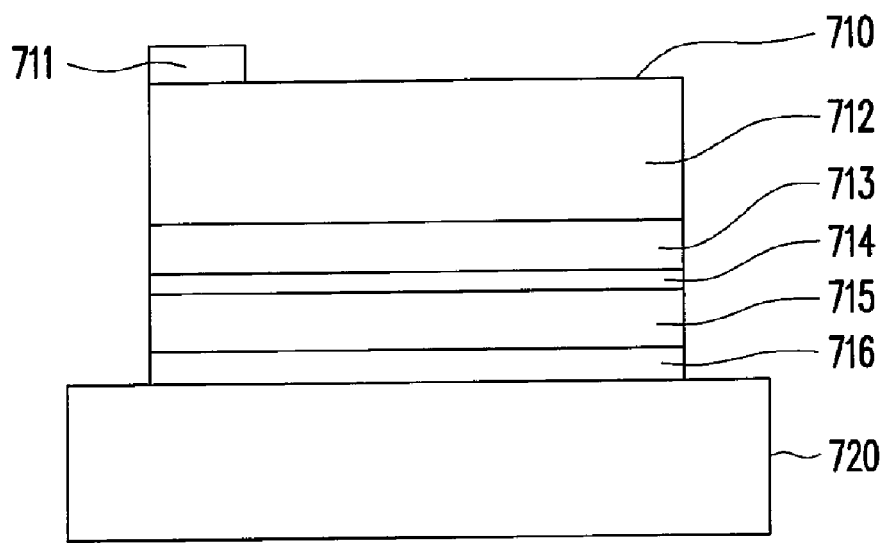
FIG. 15 is a cross-sectional diagram illustrating a structure of a light emitting device according to one embodiment of the present invention.

As for a flip chip LED having a vertical type structure, FIG. 15 is a cross-sectional diagram illustrating a structure of a light emitting device according to one embodiment of the present invention. Referring to FIG. 15, the light emitting device 700a of the present embodiment is a vertical type LED, which includes a light emitting chip 710 and a magnetic submount 720. The light emitting chip 710 is disposed on the magnetic submount 720 through an epoxy, a metal bonding, a wafer bonding, epitaxy embedding, or a coating process.

The light emitting chip 710 includes, from top to bottom, a first electrode 711, a substrate 712, a first doped layer 713, an active layer 714, a second doped layer 715, and a second electrode 716, in which the first doped layer 713, the active layer 714, and the second doped layer 715 form a light emitting stacking layer, which is disposed under the substrate 712. The first electrode 711 is disposed on the first doped layer 713 and electrically coupled to the first doped layer 713, and the second electrode 716 is disposed under the second doped layer 715 and electrically coupled to the second doped layer 715, so as to form a vertical type LED structure. The active layer 714 is disposed between first electrode 711 and the second electrode 716, and capable of generating light when a current flows through it.

The magnetic field induced by the magnetic submount 720 is exerted on the light emitting chip 710, such that the main distribution of current density in the light emitting chip 710 is moved from an area between the first electrode 711 and the second electrode 715 to an area under the light-out plane, so as to enhance the current homogeneity and increase an overall brightness of the light emitting device 700a.

Figure 16:
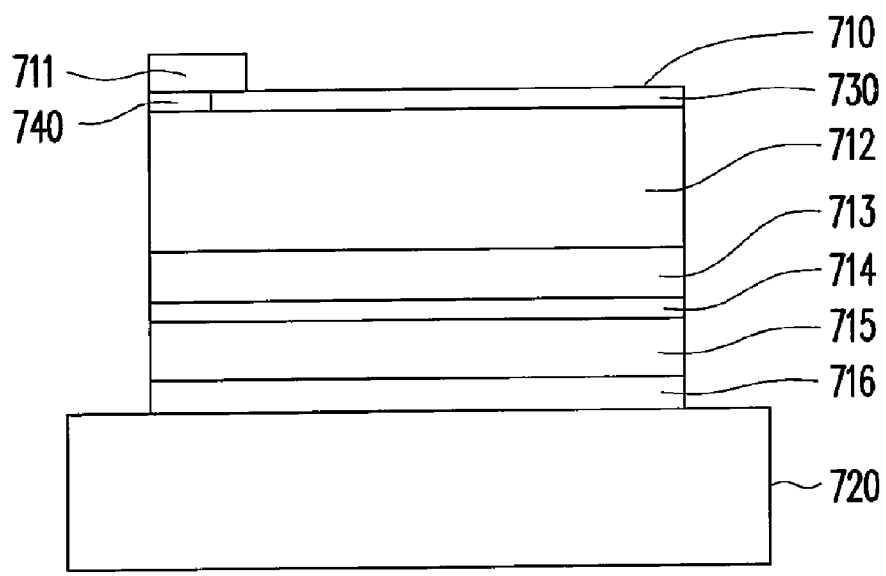
FIG. 16 is a cross-sectional diagram illustrating a structure of a light emitting device according to one embodiment of the present invention.

In one embodiment of the present invention, a transparent conductive layer (TCL) and a block layer are further disposed in the light emitting device to enhance the brightness thereof. FIG. 16 is a cross-sectional diagram illustrating a structure of a light emitting device according to one embodiment of the present invention. Referring to FIG. 16, in the light emitting device 700b of the present embodiment, a transparent conductive layer 730 is further disposed above the substrate 712 as described in the previous embodiment, so as to enhance the effect of current crowding. Moreover, a block layer 740 is also disposed between the first electrode 711 and the substrate 712 for blocking a part of the electrical connection between the first electrode 711 and the substrate 712. Accordingly, the block layer 740 blocks most current paths under the first electrode 711 and only leaves a small gap for the current to flow out, such that the main distribution of current density is moved from an area under the first electrode 711 to an area under the light-out plane, thus increasing the brightness of the light emitting device 700b.

Figure 17:
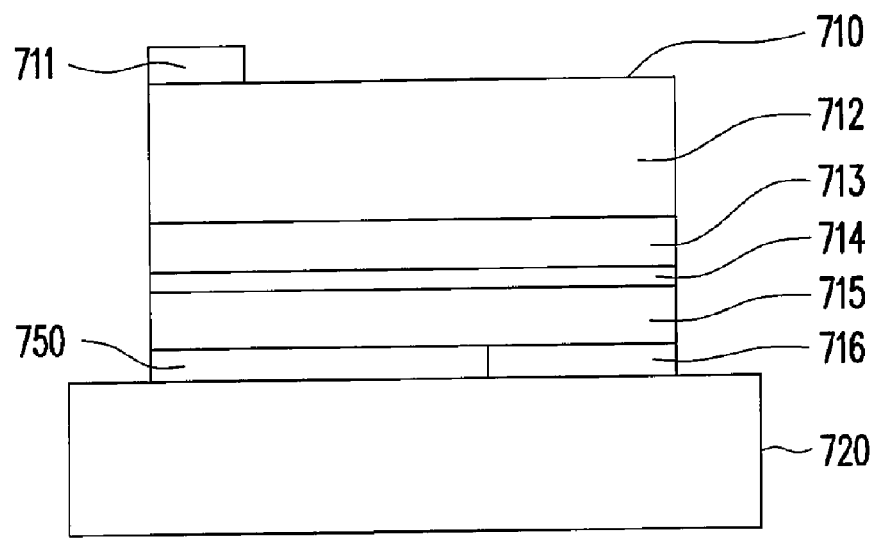
FIG. 17 is a cross-sectional diagram illustrating a structure of a light emitting device according to one embodiment of the present invention.

In one embodiment of the present invention, an isolating layer is further disposed in the light emitting device to enhance the brightness thereof. FIG. 17 is a cross-sectional diagram illustrating a structure of a light emitting device according to one embodiment of the present invention. Referring to FIG. 17, in the light emitting device 700c of the present embodiment, an isolating layer 750 is further disposed between the second doped layer 715 and the magnetic substrate 720 as described in the previous embodiment. Similar to the effect of block layer 740, the isolating layer 750 blocks most current paths under the first electrode 711 and forces the main distribution of current density out of an area under the first electrode 711 to an area under the light-out plane, thus increasing the brightness of the light emitting device 700c.

Figure 18:
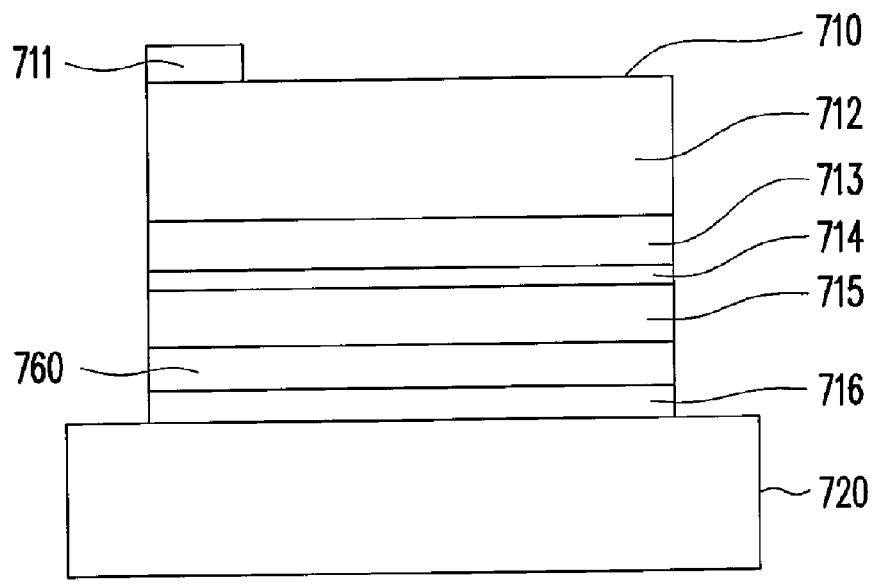
FIG. 18 is a cross-sectional diagram illustrating a structure of a light emitting device according to one embodiment of the present invention.

In one embodiment of the present invention, a mirror layer is further disposed in the light emitting device to enhance the brightness thereof. FIG. 18 is a cross-sectional diagram illustrating a structure of a light emitting device according to one embodiment of the present invention. Referring to FIG. 18, in the light emitting device 700d of the present embodiment, a mirror layer 760 is further disposed between the second doped layer 715 and the second electrode 516 for reflecting the light emitted from the active layer 714, so as to increase the brightness of the light emitting device 700d. It should be noted herein that, in other embodiments, the mirror layer 760 may also be disposed between the second electrode 716 and the magnetic submount 720 for reflecting light, but not limited to it.

Figure 19:
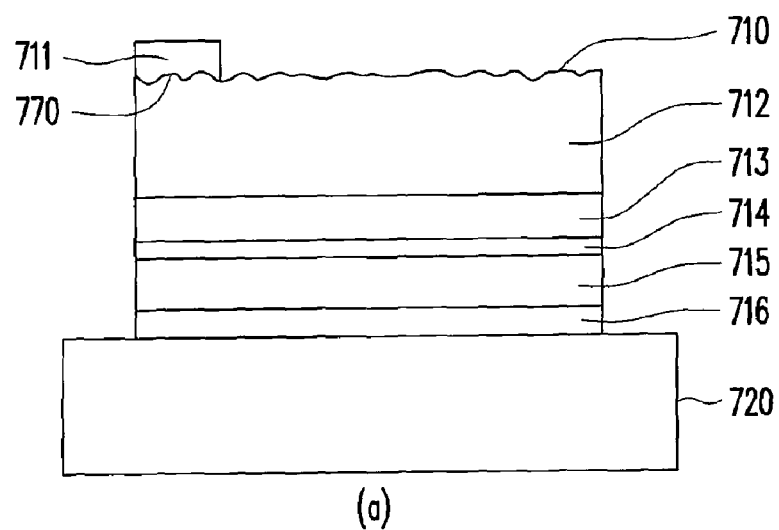
FIG. 19(a)~19(c) are cross-sectional diagrams illustrating a structure of a light emitting device according to one embodiment of the present invention.
Figure 19:
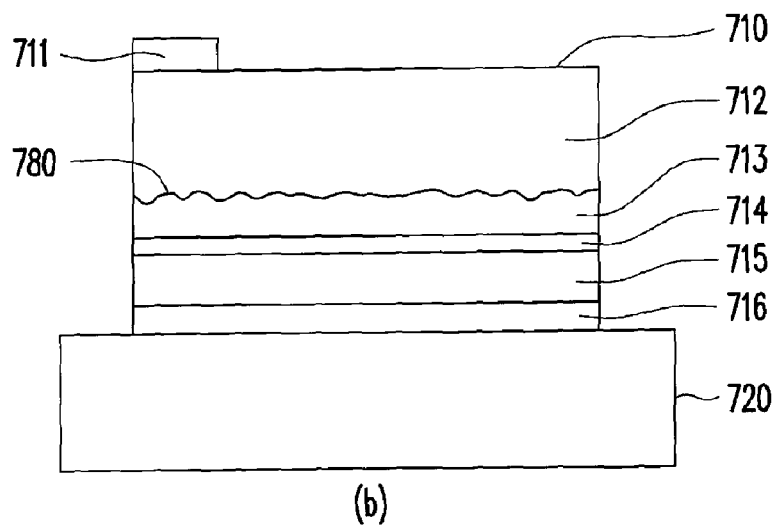
Figure 19:
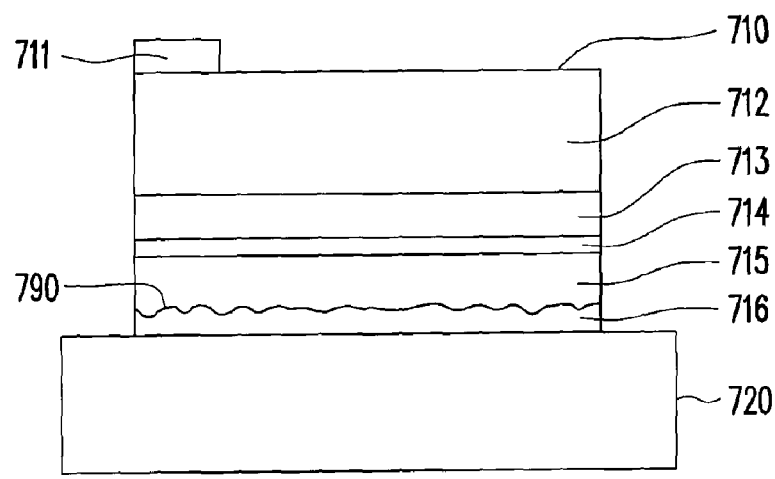

In one embodiment of the present invention, a roughness pattern, a trapezoid pattern, a round pattern, or a photonic crystal layer is further fabricated to enhance the brightness of the light emitting device. FIG. 19(a)~19(c) are cross-sectional diagrams illustrating a structure of a light emitting device according to one embodiment of the present invention. Referring to FIG. 19(a), in the light emitting device 700e of the present embodiment, a roughness pattern 770 is fabricated on a top surface of the substrate 712 to increase the surface reflectivity of the substrate 712. Moreover, the roughness pattern may be fabricated on the top surface of the first doped layer 713 (or the bottom surface of the substrate 712) to increase the surface reflectivity of the first doped layer 713 (roughness pattern 780, as shown in FIG. 19(b)), or fabricated on the top surface of the second electrode 716 (or the bottom surface of the second doped layer 715) to increase the surface reflectivity of the second electrode 716 (roughness pattern 790, as shown in FIG. 19(c)). It should be noted herein that the roughness pattern as described above, a trapezoid pattern, a round pattern, or a photonic crystal layer may be fabricated on one or a plurality of the top surfaces and the bottom surfaces of the substrate 712, the first doped layer 713, the second doped layer 715, the first electrode 711, the second electrode 716, the magnetic submount 720, and the combination thereof, which is not limited to them.

Figure 20:
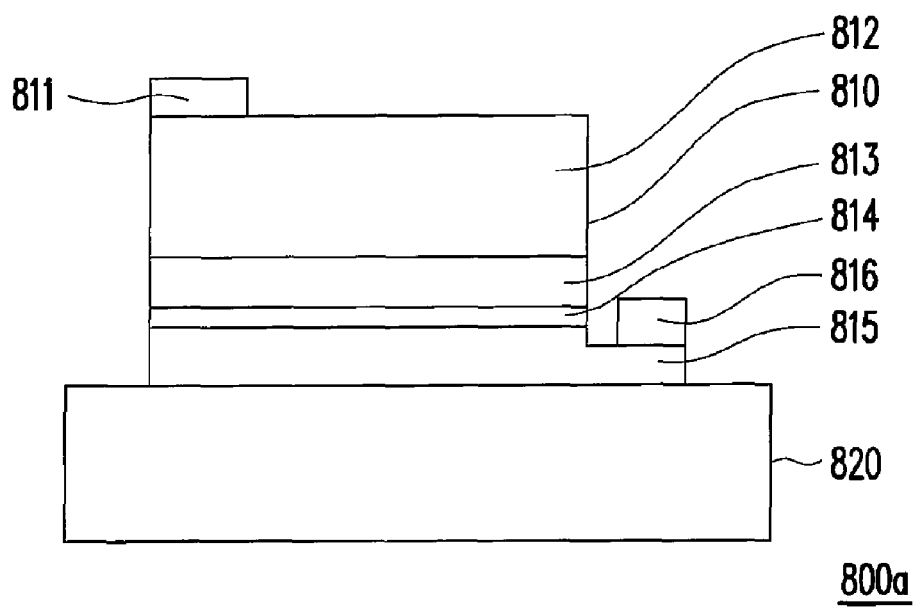
FIG. 20 is a cross-sectional diagram illustrating a structure of a light emitting device according to one embodiment of the present invention.

As for a flip chip LED having a horizontal type structure, FIG. 20 is a cross-sectional diagram illustrating a structure of a light emitting device according to one embodiment of the present invention. Referring to FIG. 20, the light emitting device 800a of the present embodiment is a horizontal type LED, which includes a light emitting chip 810 and a magnetic submount 820. The light emitting chip 810 is disposed on the magnetic submount 820 through an epoxy, a metal bonding, a wafer bonding, epitaxy embedding, or a coating process.

The light emitting chip 810 includes, from top to bottom, a first electrode 811, a substrate 812, a first doped layer 813, an active layer 814, and a second doped layer 815, in which the first doped layer 813, the active layer 814, and the second doped layer 815 form a light emitting stacking layer, which is disposed under the substrate 812. The first electrode 811 is disposed on the substrate 812 and electrically coupled to the first doped layer 813, and the second electrode 816 is disposed on a surface of the second doped layer 815 uncovered by the active layer 814 and electrically coupled to the second doped layer 815, so as to form a horizontal type LED structure. The active layer 814 is disposed between first electrode 811 and the second electrode 816, and capable of generating light when a current flows through it.

The magnetic field induced by the magnetic submount 820 is exerted on the light emitting chip 810, such that the main distribution of current density in the light emitting chip 810 is moved from an area under the electrodes 811 to an area under the light-out plane, so as to enhance the current homogeneity and increase an overall brightness of the light emitting device 800a.

Figure 21:
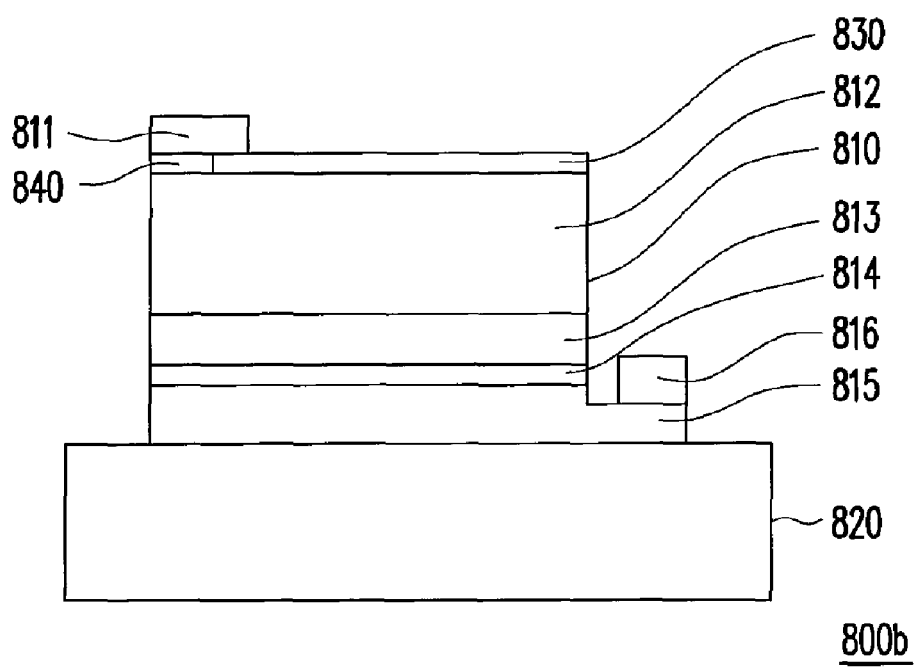
FIG. 21 is a cross-sectional diagram illustrating a structure of a light emitting device according to one embodiment of the present invention.

In one embodiment of the present invention, a transparent conductive layer and a block layer are further disposed in the light emitting device to enhance the brightness thereof. FIG. 21 is a cross-sectional diagram illustrating a structure of a light emitting device according to one embodiment of the present invention. Referring to FIG. 21, in the light emitting device 800b of the present embodiment, a transparent conductive layer 830 is further disposed above the substrate 812 as described in the previous embodiment, so as to enhance the effect of current crowding. Moreover, a block layer 840 is also disposed between the first electrode 811 and the substrate 812 for blocking a part of the electrical connection between the first electrode 811 and the substrate 812. Accordingly, the block layer 640 blocks most current paths under the first electrode 811 and only leaves a small gap for the current to flow out, such that the main distribution of current density is moved from an area under the first electrode 811 to an area under the light-out plane, thus increasing the brightness of the light emitting device 800b.

Figure 22:
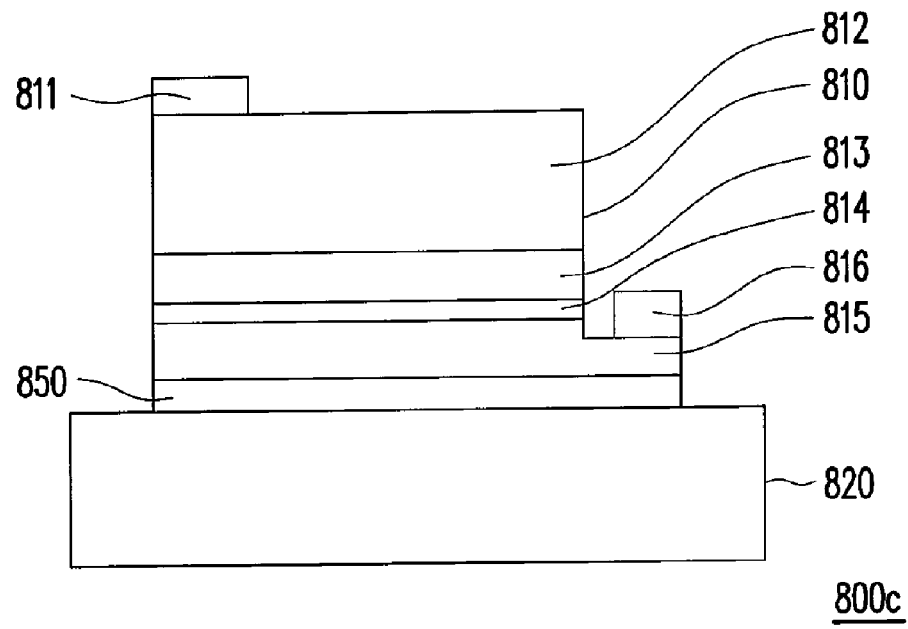
FIG. 22 is a cross-sectional diagram illustrating a structure of a light emitting device according to one embodiment of the present invention.

In one embodiment of the present invention, an isolating layer is further disposed in the light emitting device to enhance the brightness thereof. FIG. 22 is a cross-sectional diagram illustrating a structure of a light emitting device according to one embodiment of the present invention. Referring to FIG. 22, in the light emitting device 800c of the present embodiment, an isolating layer 860 is further disposed between the second doped layer 815 and the magnetic submount 820 as described in the previous embodiment. Similar to the effect of block layer 840, the isolating layer 850 blocks most current paths between the first electrode 811 and the magnetic submount 820, such that the main distribution of current density is moved to an area under the light-out plane, thus increasing the brightness of the light emitting device 800c.

Figure 23:
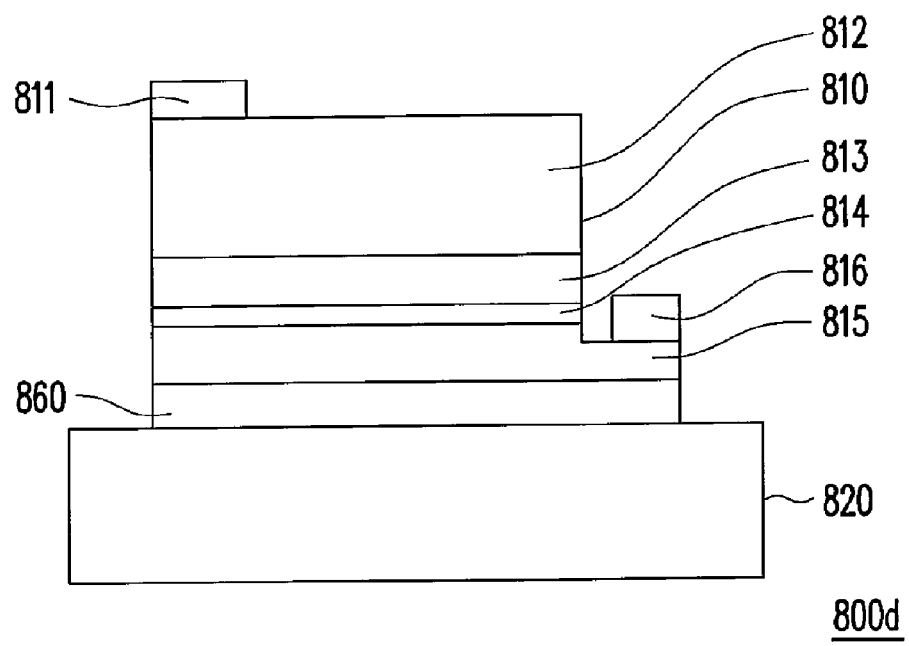
FIG. 23 is a cross-sectional diagram illustrating a structure of a light emitting device according to one embodiment of the present invention.

In one embodiment of the present invention, a mirror layer is further disposed in the light emitting device to enhance the brightness thereof. FIG. 23 is a cross-sectional diagram illustrating a structure of a light emitting device according to one embodiment of the present invention. Referring to FIG. 23, in the light emitting device 800d of the present embodiment, a mirror layer 860 is further disposed between the second doped layer 815 and the magnetic submount 820 for reflecting the light emitted from the active layer 814, so as to increase the brightness of the light emitting device 800d.

Figure 24:
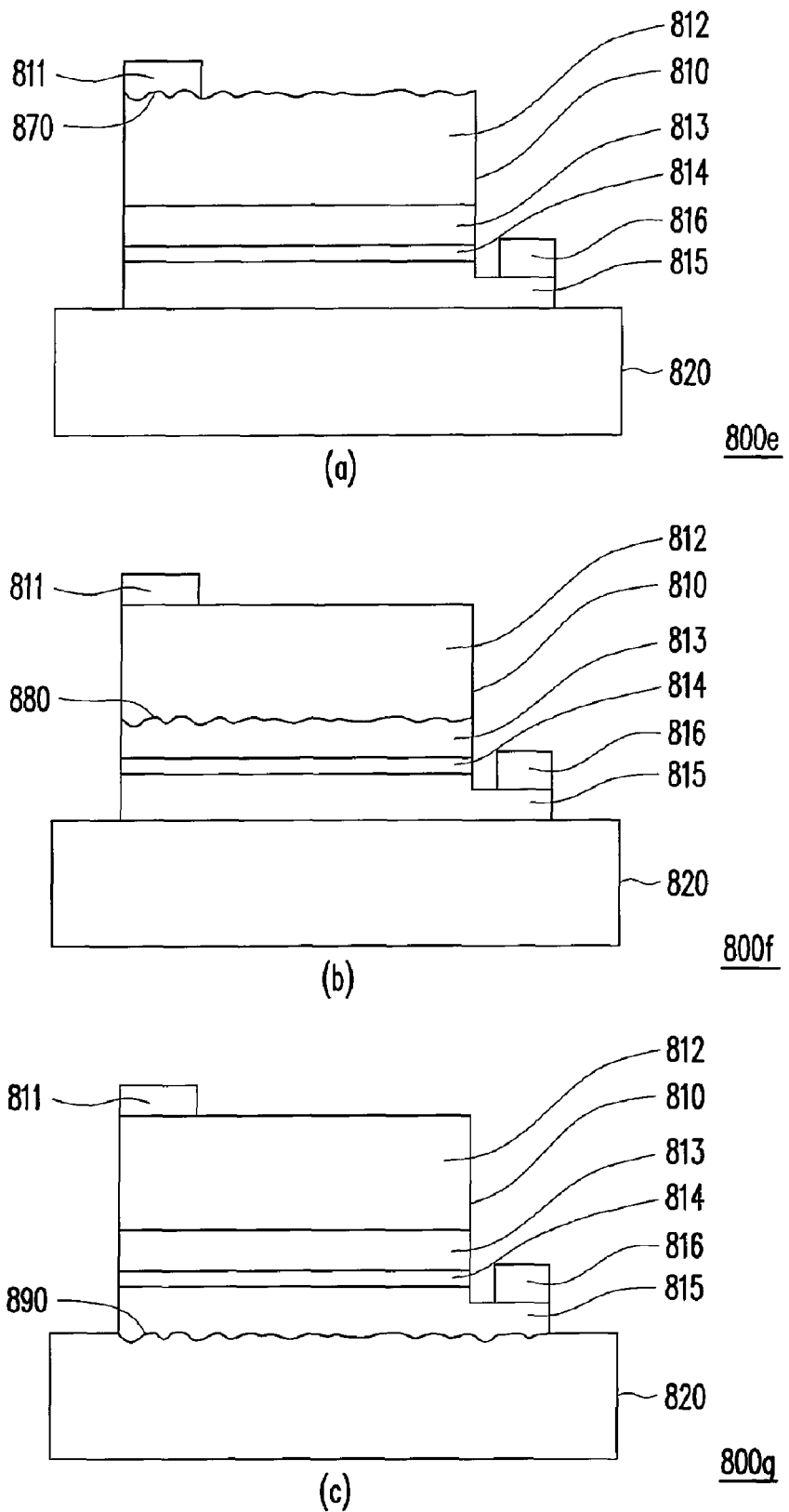
FIG. 24(a)~24(c) are cross-sectional diagrams illustrating a structure of a light emitting device according to one embodiment of the present invention.

In one embodiment of the present invention, a roughness pattern, a trapezoid pattern, a round pattern, or a photonic crystal layer is further fabricated to enhance the brightness of the light emitting device. FIG. 24(a)~24(c) are cross-sectional diagrams illustrating a structure of a light emitting device according to one embodiment of the present invention. Referring to FIG. 24(a), in the light emitting device 800e of the present embodiment, a roughness pattern 870 is fabricated on a top surface of the substrate 812 to increase the surface reflectivity of the substrate 812. Moreover, the roughness pattern may be fabricated on the top surface of the first doped layer 813 (or the bottom surface of the substrate 812) to increase the surface reflectivity of the first doped layer 813 (roughness pattern 880, as shown in FIG. 24(b)), or fabricated on the top surface of the magnetic submount 820 (or the bottom surface of the second doped layer 815) to increase the surface reflectivity of the magnetic submount 820 (roughness pattern 890, as shown in FIG. 24(c)). It should be noted herein that the roughness pattern as described above, a trapezoid pattern, a round pattern, or a photonic crystal layer may be fabricated on one or a plurality of the top surfaces and the bottom surfaces of the substrate 812, the first doped layer 813, the second doped layer 815, the first electrode 811, the magnetic submount 820, and the combination thereof, which is not limited to them.

Figure 25:
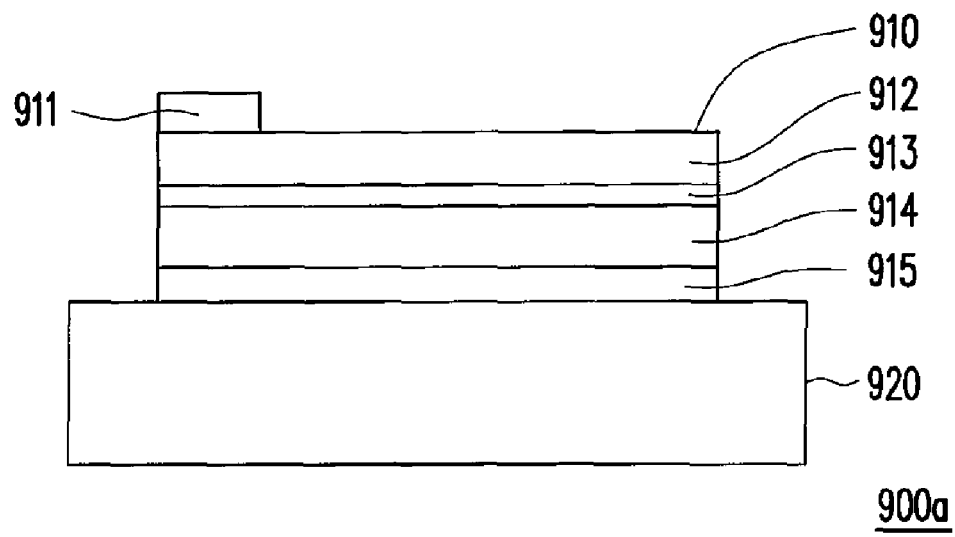
FIG. 25 is a cross-sectional diagram illustrating a structure of a light emitting device according to one embodiment of the present invention.

As for a thin film LED having a vertical type structure, FIG. 25 is a cross-sectional diagram illustrating a structure of a light emitting device according to one embodiment of the present invention. Referring to FIG. 25, the light emitting device 900a of the present embodiment is a vertical type LED, which includes a light emitting chip 910 and a magnetic submount 920. The light emitting chip 910 is disposed on the magnetic submount 920 through an epoxy, a metal bonding, a wafer bonding, epitaxy embedding, or a coating process.

The light emitting chip 910 includes, from top to bottom, a first electrode 911, a first doped layer 912, an active layer 913, a second doped layer 914, and a second electrode 915, in which the first doped layer 912, the active layer 913, and the second doped layer 914 form a light emitting stacking layer. The first electrode 911 is disposed on the first doped layer 912 and electrically coupled to the first doped layer 912, and the second electrode 915 is disposed under the second doped layer 914 and electrically coupled to the second doped layer 914, so as to form a vertical type LED structure. The active layer 913 is disposed between first electrode 911 and the second electrode 916, and capable of generating light when a current flows through it.

The magnetic field induced by the magnetic submount 920 is exerted on the light emitting chip 910, such that the main distribution of current density in the light emitting chip 910 is moved from an area between the first electrode 911 and the second electrode 915 to an area under the light-out plane, so as to enhance the current homogeneity and increase an overall brightness of the light emitting device 900a.

Figure 26:
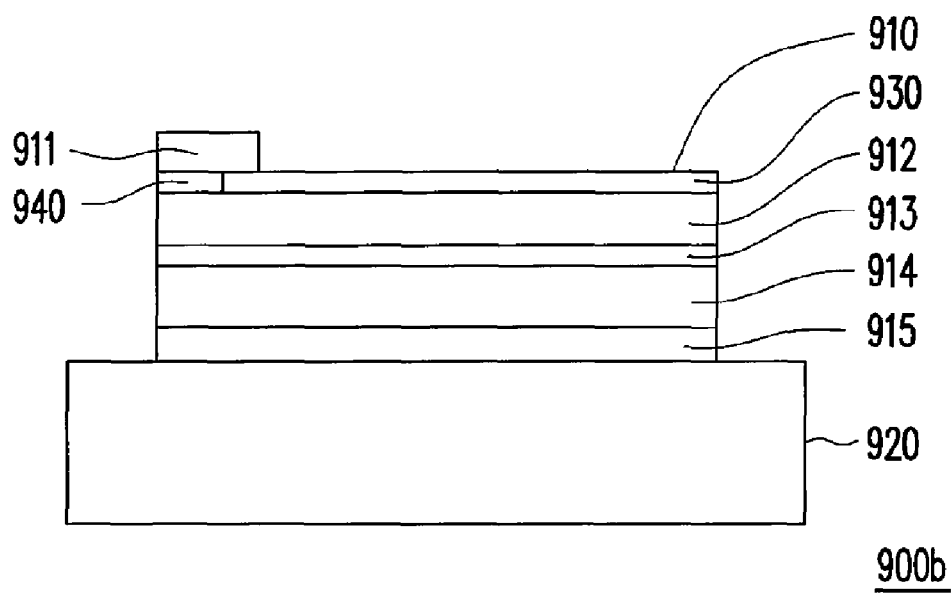
FIG. 26 is a cross-sectional diagram illustrating a structure of a light emitting device according to one embodiment of the present invention.

In one embodiment of the present invention, a transparent conductive layer (TCL) and a block layer are further disposed in the light emitting device to enhance the brightness thereof. FIG. 26 is a cross-sectional diagram illustrating a structure of a light emitting device according to one embodiment of the present invention. Referring to FIG. 26, in the light emitting device 900b of the present embodiment, a transparent conductive layer 930 is further disposed above the first doped layer 912 as described in the previous embodiment, so as to enhance the effect of current crowding. Moreover, a block layer 940 is also disposed between the first electrode 911 and the first doped layer 912 for blocking a part of the electrical connection between the first electrode 911 and the first doped layer 912. Accordingly, the block layer 940 blocks most current paths under the first electrode 911 and only leaves a small gap for the current to flow out, such that the main distribution of current density is moved from an area under the first electrode 911 to an area under the light-out plane, thus increasing the brightness of the light emitting device 900b.

Figure 27:
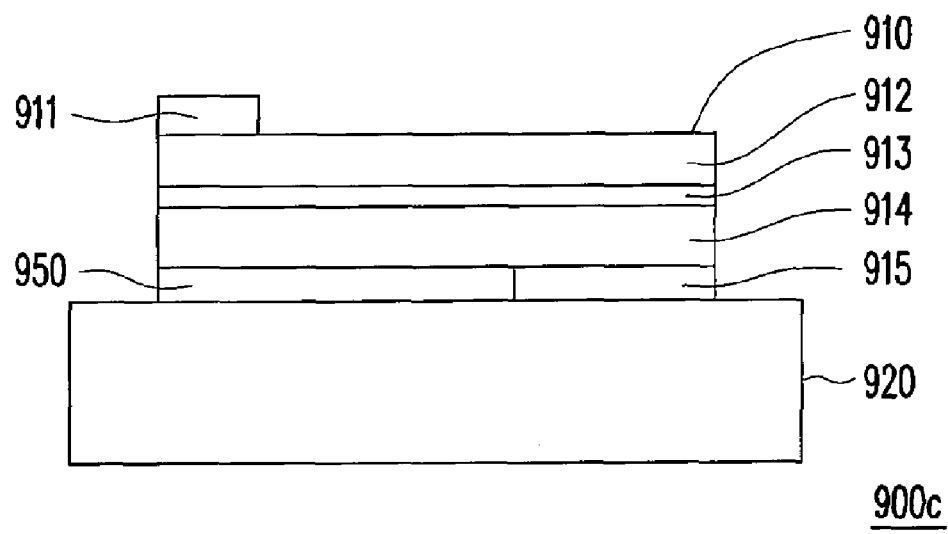
FIG. 27 is a cross-sectional diagram illustrating a structure of a light emitting device according to one embodiment of the present invention.

In one embodiment of the present invention, an isolating layer is further disposed in the light emitting device to enhance the brightness thereof. FIG. 27 is a cross-sectional diagram illustrating a structure of a light emitting device according to one embodiment of the present invention. Referring to FIG. 27, in the light emitting device 900c of the present embodiment, an isolating layer 950 is further disposed between the second doped layer 914 and the magnetic submount 920 as described in the previous embodiment. Similar to the effect of block layer 940, the isolating layer 950 blocks most current paths under the first electrode 911 and forces the main distribution of current density out of an area under the first electrode 911 to an area under the light-out plane, thus increasing the brightness of the light emitting device 900c.

Figure 28:
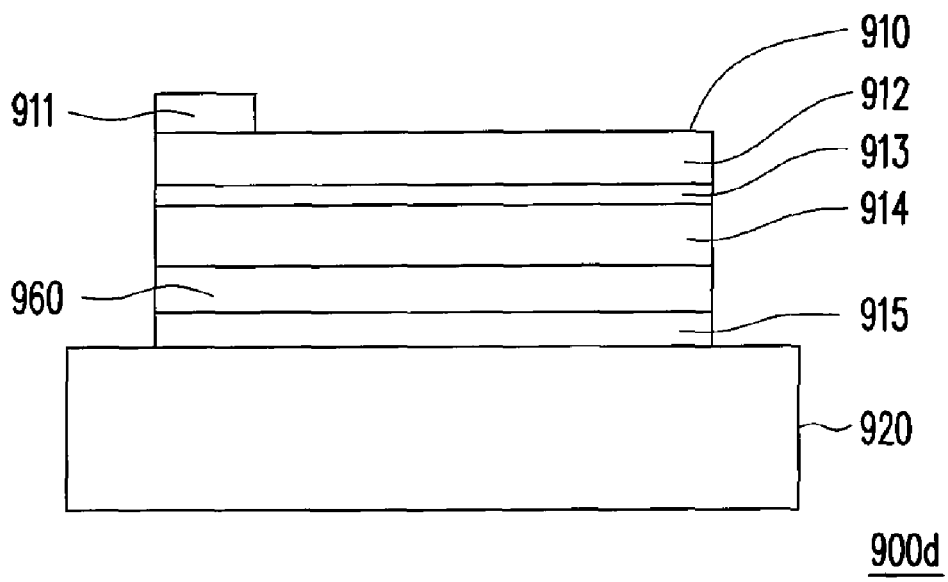
FIG. 28 is a cross-sectional diagram illustrating a structure of a light emitting device according to one embodiment of the present invention.

In one embodiment of the present invention, a mirror layer is further disposed in the light emitting device to enhance the brightness thereof. FIG. 28 is a cross-sectional diagram illustrating a structure of a light emitting device according to one embodiment of the present invention. Referring to FIG. 28, in the light emitting device 900d of the present embodiment, a mirror layer 960 is further disposed between the second doped layer 914 and the second electrode 915 for reflecting the light emitted from the active layer 913, so as to increase the brightness of the light emitting device 900d. It should be noted herein that, in other embodiments, the mirror layer 960 may also be disposed between the second electrode 915 and the magnetic submount 920 for reflecting light, but not limited to it.

Figure 29:
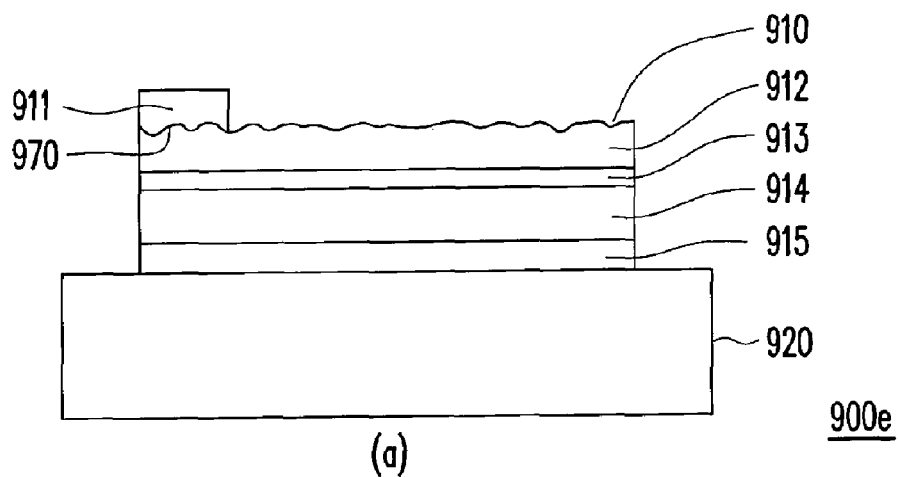
FIG. 29(a)~29(c) are cross-sectional diagrams illustrating a structure of a light emitting device according to one embodiment of the present invention.
Figure 29:
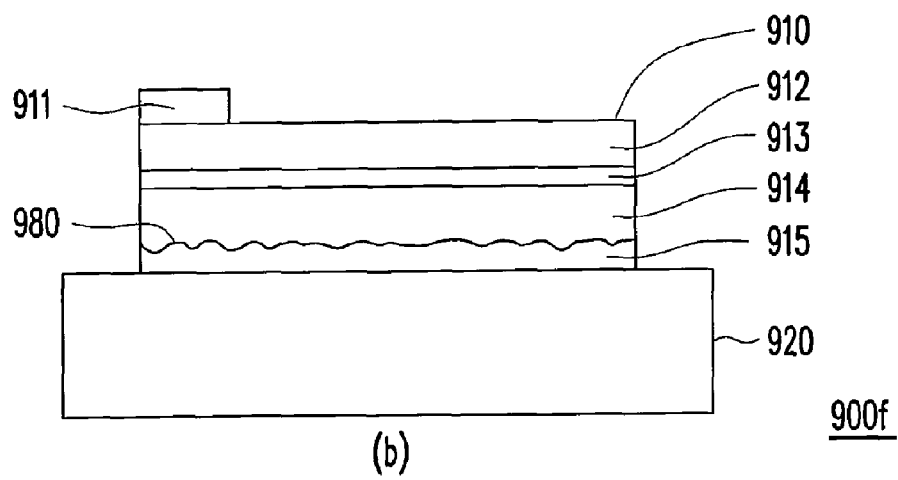
Figure 29:
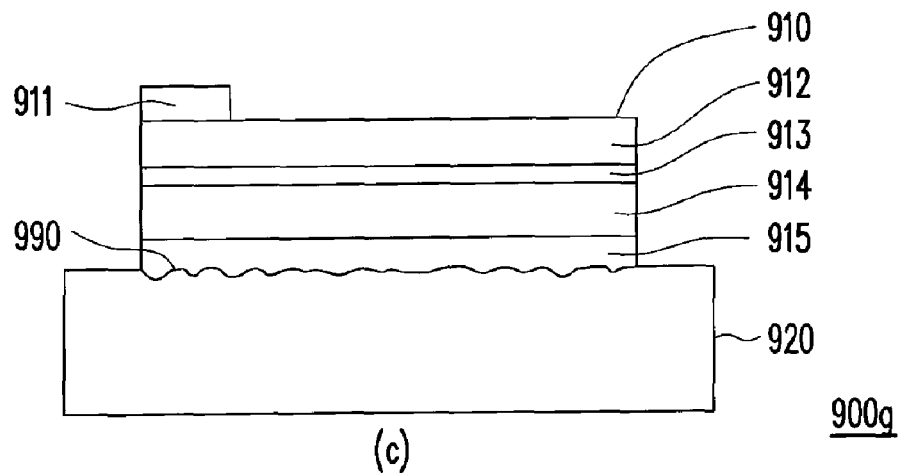

In one embodiment of the present invention, a roughness pattern, a trapezoid pattern, a round pattern, or a photonic crystal layer is further fabricated to enhance the brightness of the light emitting device. FIG. 29(a)~29(c) are cross-sectional diagrams illustrating a structure of a light emitting device according to one embodiment of the present invention. Referring to FIG. 29(a), in the light emitting device 900e of the present embodiment, a roughness pattern 970 is fabricated on a top surface of the first doped layer 912 to increase the surface reflectivity of the first doped layer 912. Moreover, the roughness pattern may be fabricated on the top surface of the second electrode 915 (or the bottom surface of the second doped layer 914) to increase the surface reflectivity of the second electrode 915 (roughness pattern 980, as shown in FIG. 29(b)), or fabricated on the top surface of the magnetic submount 920 (or the bottom surface of the second electrode 915) to increase the surface reflectivity of the magnetic submount 920 (roughness pattern 990, as shown in FIG. 29(c)). It should be noted herein that the roughness pattern as described above, a trapezoid pattern, a round pattern or a photonic crystal layer may be fabricated on one or a plurality of the top surfaces and the bottom surfaces of the first doped layer 912, the second doped layer 914, the first electrode 911, the second electrode 915, the magnetic submount 920, and the combination thereof, which is not limited to them.

Figure 30:
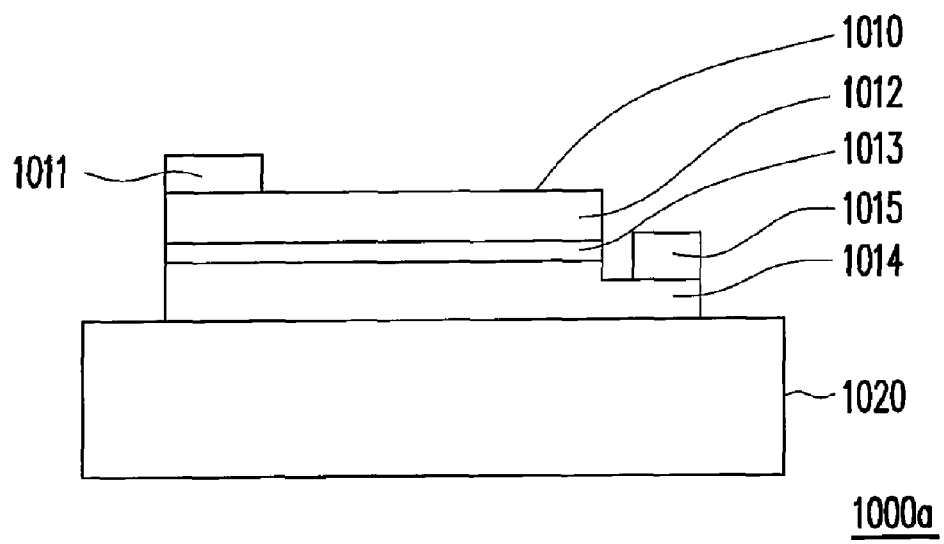
FIG. 30 is a cross-sectional diagram illustrating a structure of a light emitting device according to one embodiment of the present invention.

As for a thin film LED having a horizontal type structure, FIG. 30 is a cross-sectional diagram illustrating a structure of a light emitting device according to one embodiment of the present invention. Referring to FIG. 30, the light emitting device 1000a of the present embodiment is a horizontal type LED, which includes a light emitting chip 1010 and a magnetic submount 1020. The light emitting chip 1010 is disposed on the magnetic submount 1020 through an epoxy, a metal bonding, a wafer bonding, epitaxy embedding, or a coating process.

The light emitting chip 1010 includes, from top to bottom, a first electrode 1011, a first doped layer 1012, an active layer 1013, and a second doped layer 1014, in which the first doped layer 1012, the active layer 1013, and the second doped layer 1014 form a light emitting stacking layer. The first electrode 1011 is disposed on the first doped layer 1012 and electrically coupled to the first doped layer 1012, and the second electrode 1016 is disposed on a surface of the second doped layer 1014 uncovered by the active layer 1013 and electrically coupled to the second doped layer 1014, so as to form a horizontal type LED structure. The active layer 1013 is disposed between first electrode 1011 and the second electrode 1016, and capable of generating light when a current flows through it.

The magnetic field induced by the magnetic submount 1020 is exerted on the light emitting chip 1010, such that the main distribution of current density in the light emitting chip 1010 is moved from an area under the electrodes 1011 to an area under the light-out plane, so as to enhance the current homogeneity and increase an overall brightness of the light emitting device 1000a.

Figure 31:
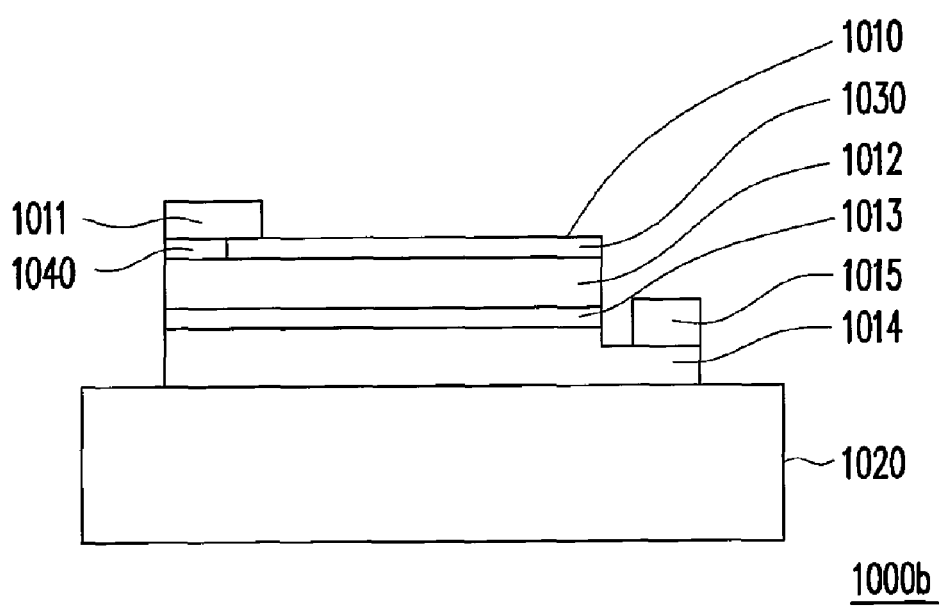
FIG. 31 is a cross-sectional diagram illustrating a structure of a light emitting device according to one embodiment of the present invention.

In one embodiment of the present invention, a transparent conductive layer and a block layer are further disposed in the light emitting device to enhance the brightness thereof. FIG. 31 is a cross-sectional diagram illustrating a structure of a light emitting device according to one embodiment of the present invention. Referring to FIG. 31, in the light emitting device 1000b of the present embodiment, a transparent conductive layer 1030 is further disposed above the first doped layer 1012 as described in the previous embodiment, so as to enhance the effect of current crowding. Moreover, a block layer 1040 is also disposed between the first electrode 1011 and the first doped layer 1012 for blocking a part of the electrical connection between the first electrode 1011 and the first doped layer 1012. Accordingly, the block layer 1040 blocks most current paths under the first electrode 1011 and only leaves a small gap for the current to flow out, such that the main distribution of current density is moved from an area under the first electrode 1011 to an area under the light-out plane, thus increasing the brightness of the light emitting device 1000b.

Figure 32:
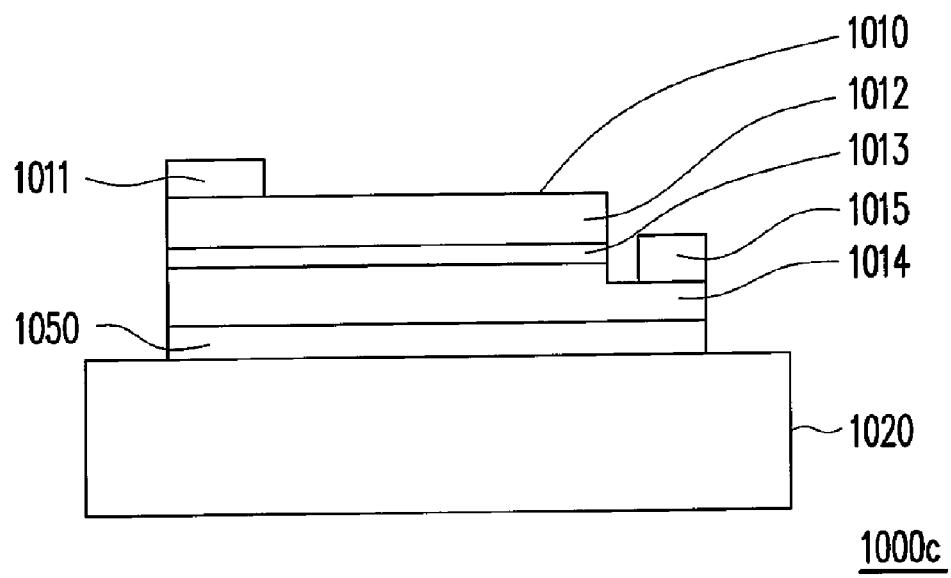
FIG. 32 is a cross-sectional diagram illustrating a structure of a light emitting device according to one embodiment of the present invention.

In one embodiment of the present invention, an isolating layer is farther disposed in the light emitting device to enhance the brightness thereof. FIG. 32 is a cross-sectional diagram illustrating a structure of a light emitting device according to one embodiment of the present invention. Referring to FIG. 32, in the light emitting device 1000c of the present embodiment, an isolating layer 1050 is further disposed between the second doped layer 1014 and the magnetic submount 1020 as described in the previous embodiment. Similar to the effect of block layer 1040, the isolating layer 1050 blocks most current paths between the first electrode 1011 and the magnetic submount 1020, such that the main distribution of current density is moved to an area under the light-out plane, thus increasing the brightness of the light emitting device 1000c.

Figure 33:
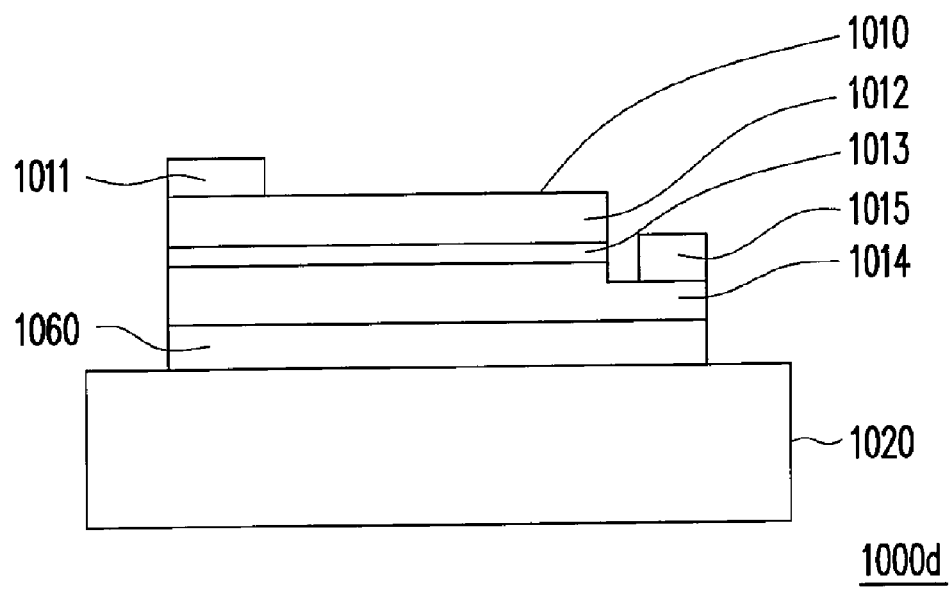
FIG. 33 is a cross-sectional diagram illustrating a structure of a light emitting device according to one embodiment of the present invention.

In one embodiment of the present invention, a mirror layer is further disposed in the light emitting device to enhance the brightness thereof. FIG. 33 is a cross-sectional diagram illustrating a structure of a light emitting device according to one embodiment of the present invention. Referring to FIG. 33, in the light emitting device 1000d of the present embodiment, a mirror layer 1060 is further disposed between the second doped layer 1014 and the magnetic submount 1020 for reflecting the light emitted from the active layer 1013, so as to increase the brightness of the light emitting device 1000d.

Figure 34:
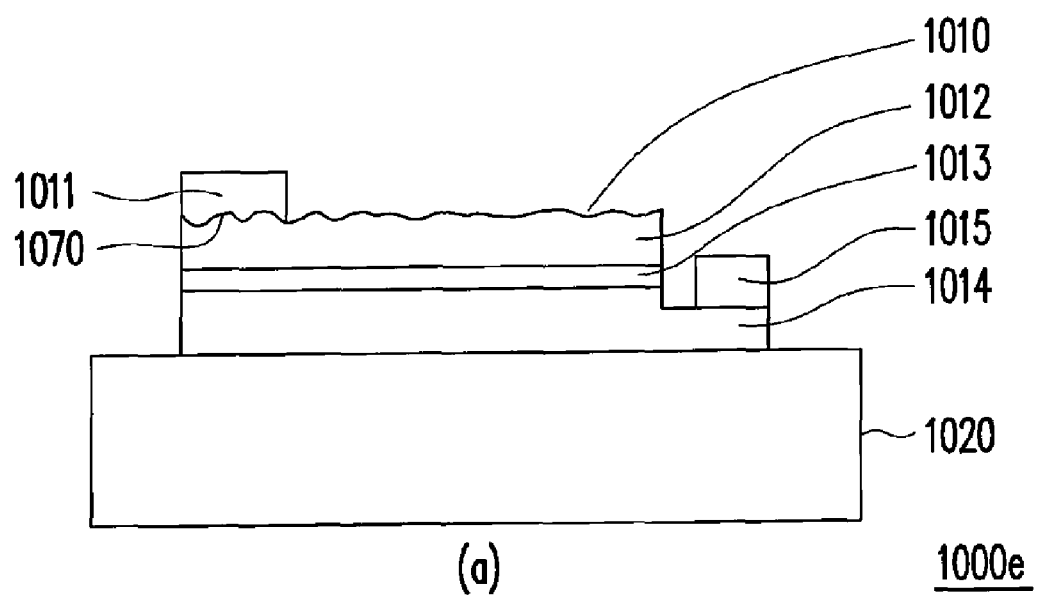
FIG. 34(a)~34(b) are cross-sectional diagrams illustrating a structure of a light emitting device according to one embodiment of the present invention.
Figure 34:
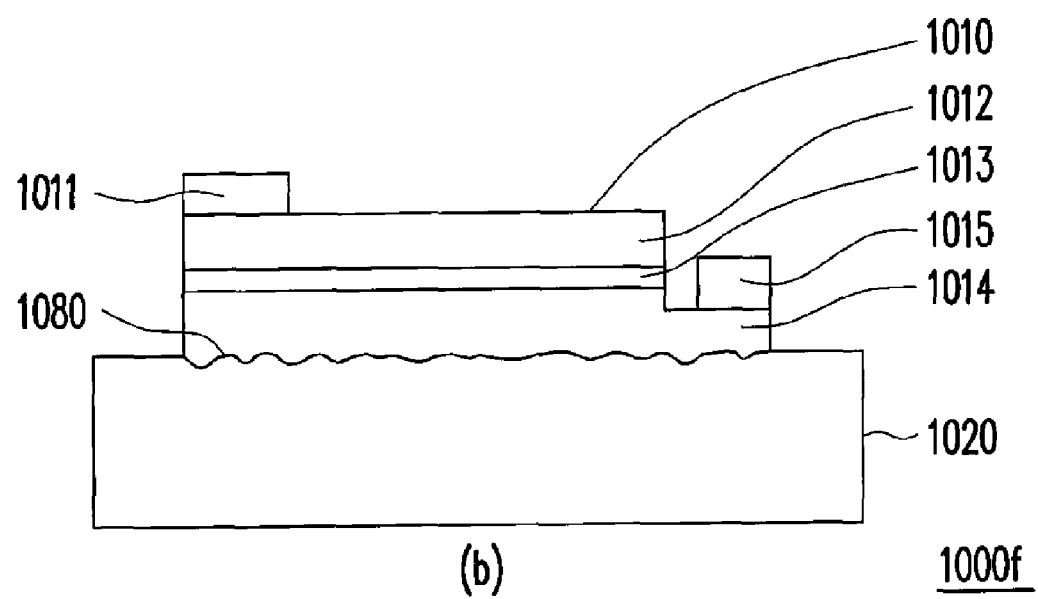

In one embodiment of the present invention, a roughness pattern, a trapezoid pattern, a round pattern, or a photonic crystal layer is further fabricated to enhance the brightness of the light emitting device. FIG. 34(a)~34(b) are cross-sectional diagrams illustrating a structure of a light emitting device according to one embodiment of the present invention. Referring to FIG. 34(a), in the light emitting device 1000e of the present embodiment, a roughness pattern 1070 is fabricated on a top surface of the first doped layer 1012 to increase the surface reflectivity of the first doped layer 1012. Moreover, the roughness pattern may be fabricated on the top surface of the magnetic submount 1020 (or the bottom surface of the second doped layer 1014) to increase the surface reflectivity of the magnetic submount 1020 (roughness pattern 1080, as shown in FIG. 34(b)). It should be noted herein that the roughness pattern as described above, a trapezoid pattern, a round pattern, or a photonic crystal layer may be fabricated on one or a plurality of the top surfaces and the bottom surfaces of the first doped layer 1012, the second doped layer 1014, the first electrode 1011, the magnetic submount 1020, and the combination thereof, which is not limited to them.

Figure 35:
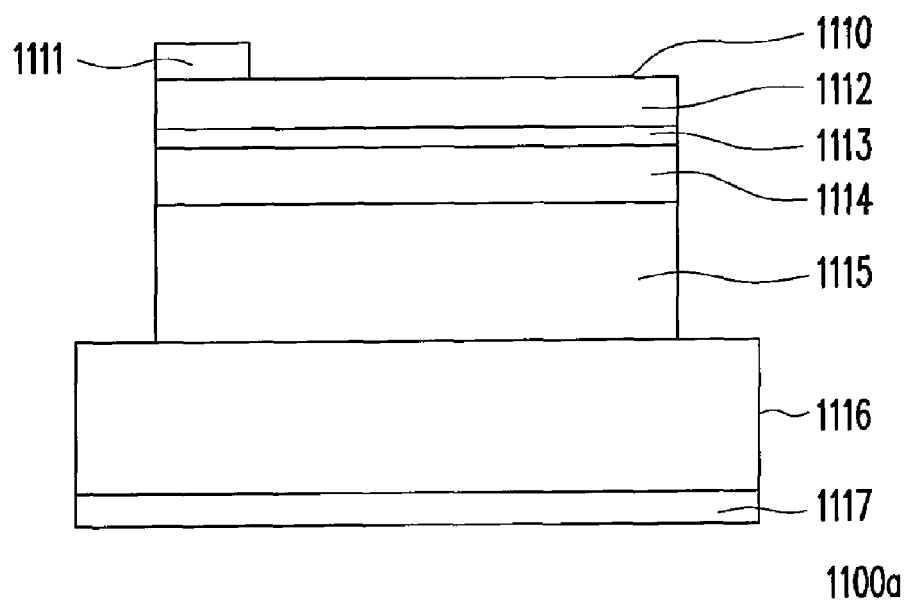
FIG. 35 is a cross-sectional diagram illustrating a structure of a light emitting device according to one embodiment of the present invention.

As for a LED having a vertical type structure in which an electrode is disposed under a magnetic submount, FIG. 35 is a cross-sectional diagram illustrating a structure of a light emitting device according to one embodiment of the present invention. Referring to FIG. 35, the light emitting device 1100a of the present embodiment is a vertical type LED, which includes, from top to bottom, a first electrode 1111, a first doped layer 1112, an active layer 1113, a second doped layer 1114, a substrate 1115, a magnetic submount 1116, and a second electrode 1117, in which the first doped layer 1112, the active layer 1113, and the second doped layer 1114 form a light emitting stacking layer, which is disposed on the substrate 1115. The first electrode 1111 is disposed on the first doped layer 1112 and electrically coupled to the first doped layer 1112, and the second electrode 1116 is disposed under the substrate 1115 and electrically coupled to the second doped layer 1114, so as to form a vertical type LED structure. The active layer 1113 is disposed between first electrode 1111 and the second electrode 1117, and capable of generating light when a current flows through it.

The magnetic field induced by the magnetic submount 1115 is exerted on the light emitting stacking layer, such that the main distribution of current density in the light emitting stacking layer is moved from an area between the first electrode 1111 and the second electrode 1117 to an area under the light-out plane, so as to enhance the current homogeneity and increase an overall brightness of the light emitting device 1100a.

Figure 36:
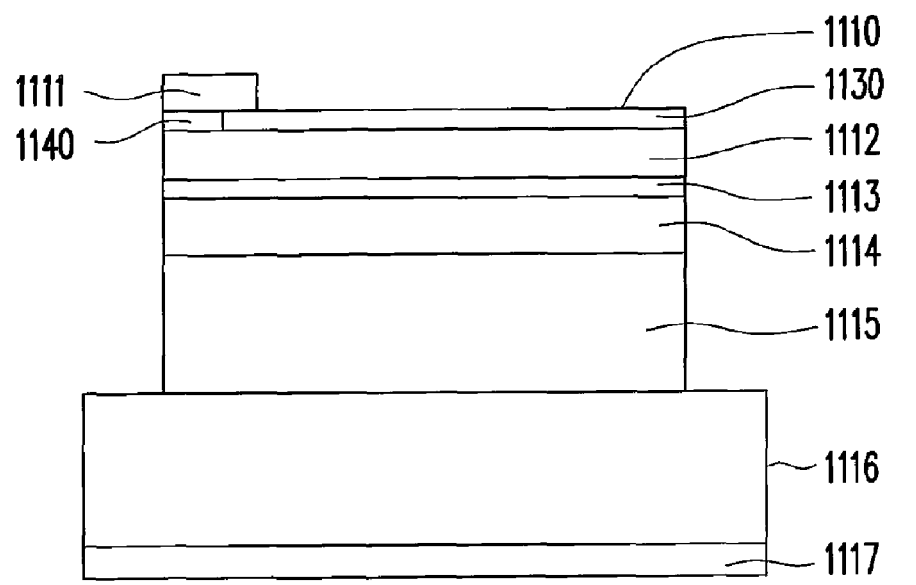
FIG. 36 is a cross-sectional diagram illustrating a structure of a light emitting device according to one embodiment of the present invention.

In one embodiment of the present invention, a transparent conductive layer and a block layer are further disposed in the light emitting device to enhance the brightness thereof. FIG. 36 is a cross-sectional diagram illustrating a structure of a light emitting device according to one embodiment of the present invention. Referring to FIG. 36, in the light emitting device 1000b of the present embodiment, a transparent conductive layer 1130 is further disposed above the first doped layer 1112 as described in the previous embodiment, so as to enhance the effect of current crowding. Moreover, a block layer 1140 is also disposed between the first electrode 1111 and the first doped layer 1112 for blocking a part of the electrical connection between the first electrode 1111 and the first doped layer 1112. Accordingly, the block layer 1140 blocks most current paths under the first electrode 1111 and only leaves a small gap for the current to flow out, such that the main distribution of current density is moved from an area under the first electrode 1111 to an area under the light-out plane, thus increasing the brightness of the light emitting device 1100b.

In one embodiment of the present invention, an isolating layer or a mirror layer may be further disposed between second doped layer 1114 and the substrate 1115, between the substrate 1115 and the magnetic submount 1116, or between the magnetic submount 1116 and the second electrode 1117 for reflecting light, so to enhance the brightness of the light emitting device. Moreover, a roughness pattern, a trapezoid pattern, a round pattern, or a photonic crystal layer may be fabricated on one or a plurality of the top surfaces and the bottom surfaces of the first doped layer 1112, the second doped layer 1114, the first electrode 1111, the second electrode 1117, the substrate 1115, the magnetic submount 1116, and the combination thereof, so as to enhance the brightness of the light emitting device.

Figure 37:
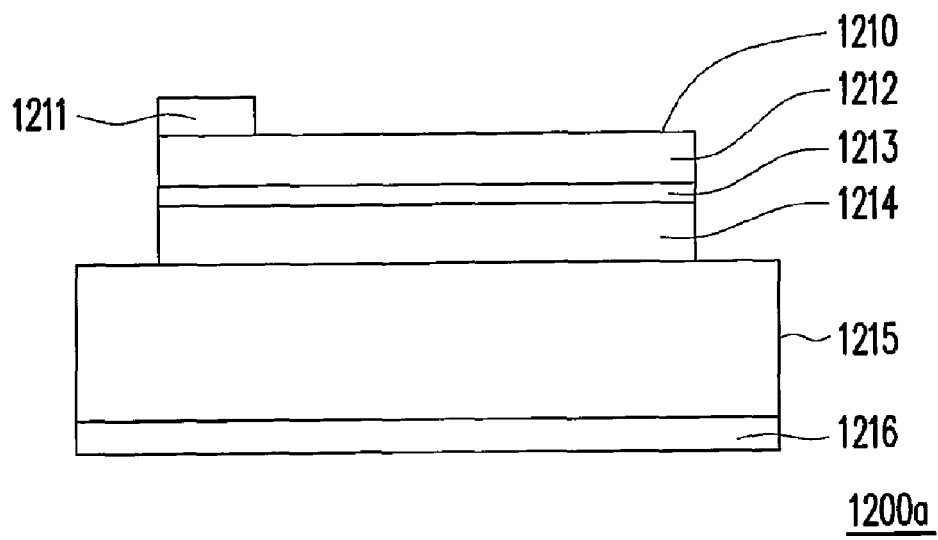
FIG. 37 is a cross-sectional diagram illustrating a structure of a light emitting device according to one embodiment of the present invention.

As for a thin film LED having a vertical type structure in which an electrode is disposed under a magnetic submount, FIG. 37 is a cross-sectional diagram illustrating a structure of a light emitting device according to one embodiment of the present invention. Referring to FIG. 37, the light emitting device 1200a of the present embodiment is a vertical type LED, which includes, from top to bottom, a first electrode 1211, a first doped layer 1212, an active layer 1213, a second doped layer 1214, a magnetic submount 1215, and a second electrode 1216, in which the first doped layer 1212, the active layer 1213, and the second doped layer 1214 form a light emitting stacking layer. The first electrode 1211 is disposed on the first doped layer 1212 and electrically coupled to the first doped layer 1212, and the second electrode 1216 is disposed under the second doped layer 1214 and electrically coupled to the second doped layer 1214, so as to form a vertical type LED structure. The active layer 1213 is disposed between first electrode 1211 and the second electrode 1217, and capable of generating light when a current flows through it.

The magnetic field induced by the magnetic submount 1215 is exerted on the light emitting stacking layer, such that the main distribution of current density in the light emitting stacking layer is moved from an area between the first electrode 1211 and the second electrode 1217 to an area under the light-out plane, so as to enhance the current homogeneity and increase an overall brightness of the light emitting device 1200a.

Figure 38:
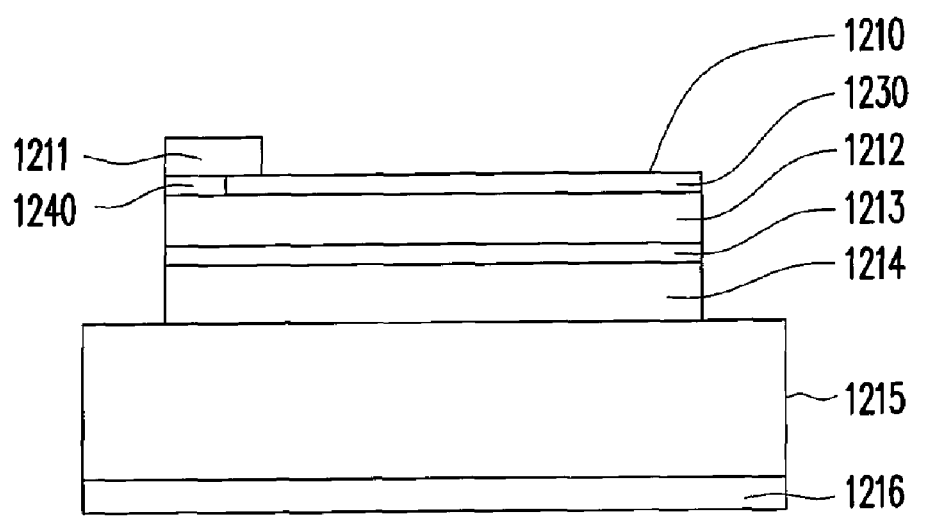
FIG. 38 is a cross-sectional diagram illustrating a structure of a light emitting device according to one embodiment of the present invention.

In one embodiment of the present invention, a transparent conductive layer and a block layer are further disposed in the light emitting device to enhance the brightness thereof. FIG. 38 is a cross-sectional diagram illustrating a structure of a light emitting device according to one embodiment of the present invention. Referring to FIG. 38, in the light emitting device 1200b of the present embodiment, a transparent conductive layer 1230 is further disposed above the first doped layer 1212 as described in the previous embodiment, so as to enhance the effect of current crowding. Moreover, a block layer 1240 is also disposed between the first electrode 1211 and the first doped layer 1212 for blocking a part of the electrical connection between the first electrode 1211 and the first doped layer 1212. Accordingly, the block layer 1240 blocks most current paths under the first electrode 1211 and only leaves a small gap for the current to flow out, such that the main distribution of current density is moved from an area under the first electrode 1211 to an area under the light-out plane, thus increasing the brightness of the light emitting device 1200b.

In one embodiment of the present invention, an isolating layer or a mirror layer may be further disposed between second doped layer 1214 and the magnetic submount 1215 for reflecting light, so to enhance the brightness of the light emitting device. Moreover, a roughness pattern, a trapezoid pattern, a round pattern, or a photonic crystal layer may be fabricated on one or a plurality of the top surfaces and the bottom surfaces of the first doped layer 1212, the second doped layer 1214, the first electrode 1211, the second electrode 1216, the magnetic submount 1215, and the combination thereof, so as to enhance the brightness of the light emitting device.

Figure 39:
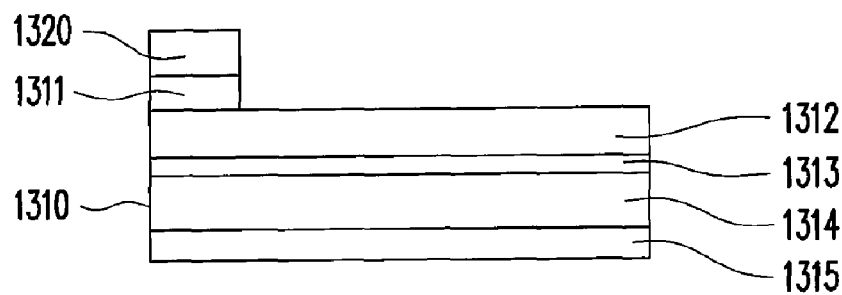
FIG. 39(a)~FIG. 39(c) are cross-sectional diagrams illustrating a structure of a light emitting device according to one embodiment of the present invention.
Figure 39:
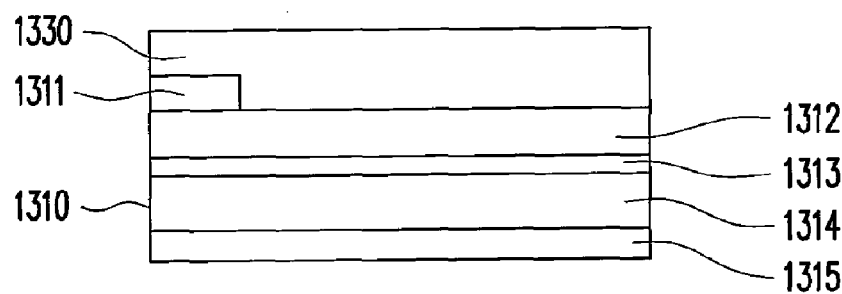
Figure 39:
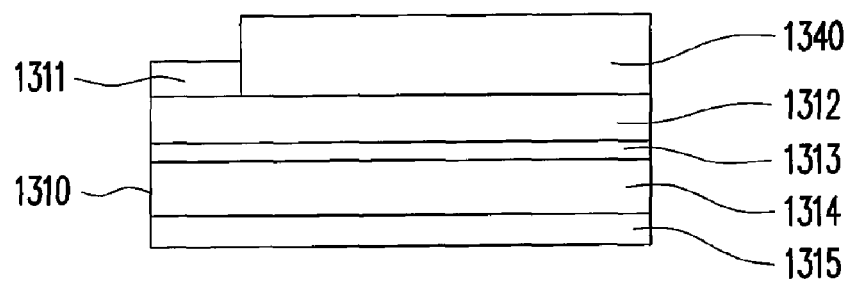

As for a LED having a vertical type structure and having a magnetic material disposed thereon, FIG. 39(a)~FIG. 39(c) are cross-sectional diagrams illustrating a structure of a light emitting device according to one embodiment of the present invention. Referring to FIG. 39(a), the light emitting device 1300a of the present embodiment is a vertical type LED, which includes a light emitting chip 1310 and a magnetic material 1320. The light emitting chip 1310 includes, from top to bottom, a first electrode 1311, a first doped layer 1312, an active layer 1313, a second doped layer 1314, and a second electrode 1315, in which the first doped layer 1312, the active layer 1313, and the second doped layer 1314 form a light emitting stacking layer. The first electrode 1311 is disposed on the first doped layer 1312 and electrically coupled to the first doped layer 1312, and the second electrode 1315 is disposed under the second doped layer 1314 and electrically coupled to the second doped layer 1314, so as to form a vertical type LED structure. The active layer 1313 is disposed between first electrode 1311 and the second electrode 1316, and capable of generating light when a current flows through it.

The magnetic material 1320 is disposed on the first electrode 1311 and exerts a magnetic field on the light emitting chip 1310, such that the main distribution of current density in the light emitting chip 1310 is moved from an area between the first electrode 1311 and the second electrode 1315 to an area under the light-out plane, so as to enhance the current homogeneity and increase an overall brightness of the light emitting device 1300a.

In other embodiments, the magnetic material may be disposed on the light emitting stacking layer and covers the first electrode (magnetic material 1330, as shown in FIG. 39(b)), or disposed on a surface of the light emitting stacking layer uncovered by the first electrode (magnetic material 1340, as shown in FIG. 39(c)).

Figure 40:
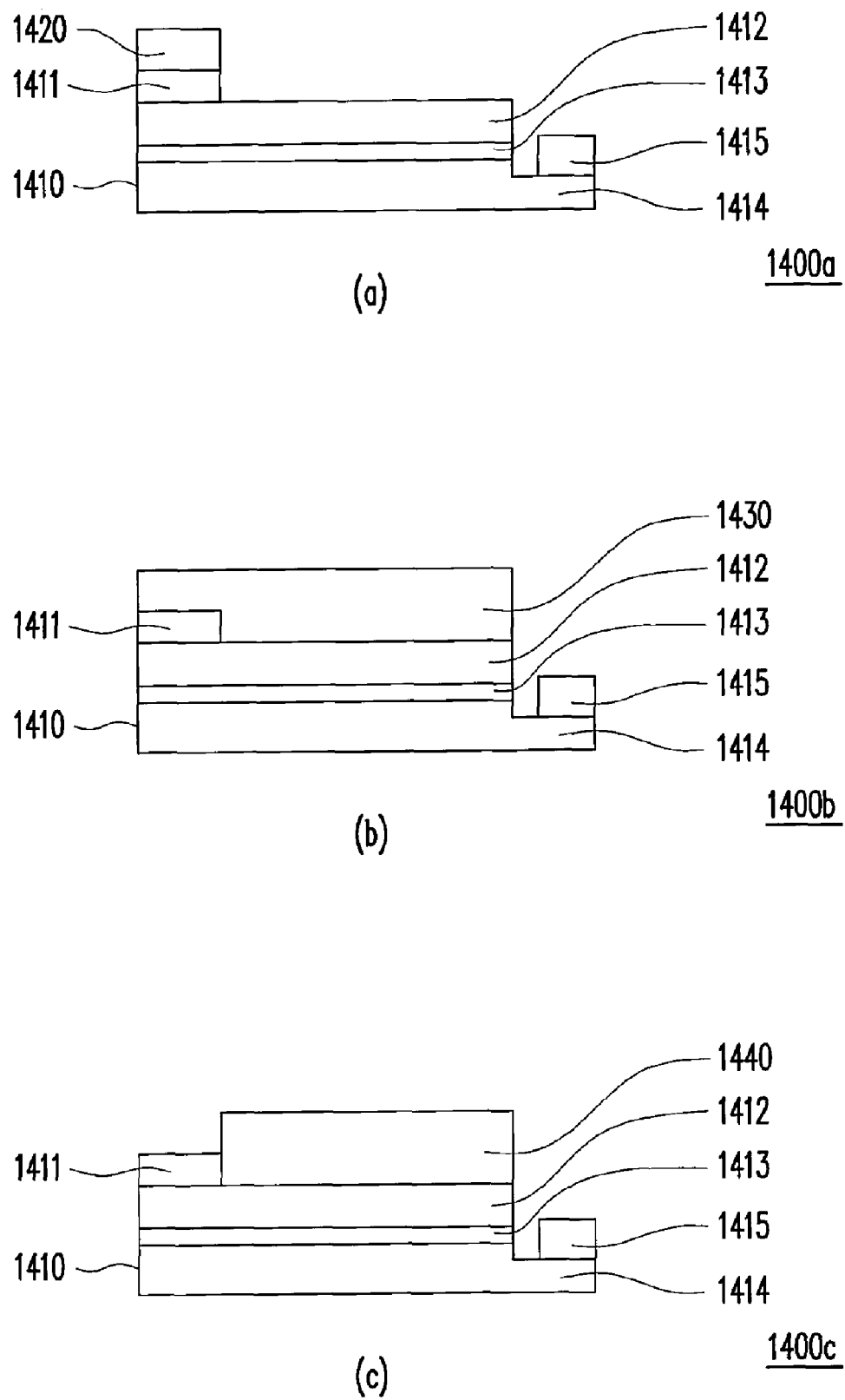
FIG. 40(a)~FIG. 40(c) are cross-sectional diagrams illustrating a structure of a light emitting device according to one embodiment of the present invention.

As for a LED having a horizontal type structure and having a magnetic material disposed thereon, FIG. 40(a)~FIG. 40(c) are cross-sectional diagrams illustrating a structure of a light emitting device according to one embodiment of the present invention. Referring to FIG. 40(a), the light emitting device 1400a of the present embodiment is a horizontal type LED, which includes a light emitting chip 1410 and a magnetic material 1420. The light emitting chip 1410 includes, from top to bottom, a first electrode 1411, a first doped layer 1412, an active layer 1413, and a second doped layer 1414, in which the first doped layer 1412, the active layer 1413, and the second doped layer 1414 form a light emitting stacking layer. The first electrode 1411 is disposed on the first doped layer 1412 and electrically coupled to the first doped layer 1412, and the second electrode 1416 is disposed on a surface of the second doped layer 1414 uncovered by the active layer 1413 and electrically coupled to the second doped layer 1414, so as to form a horizontal type LED structure. The active layer 1413 is disposed between first electrode 1411 and the second electrode 1415, and capable of generating light when a current flows through it.

The magnetic material 1420 is disposed on the first electrode 1411 and exerts a magnetic field on the light emitting chip 1410, such that the main distribution of current density in the light emitting chip 1410 is moved from an area between the first electrode 1411 and the second electrode 1415 to an area under the light-out plane, so as to enhance the current homogeneity and increase an overall brightness of the light emitting device 1400a.

In other embodiments, the magnetic material may be disposed on the light emitting stacking layer and covers the first electrode (magnetic material 1430, as shown in FIG. 40(b)), or disposed on a surface of the light emitting stacking layer uncovered by the first electrode (magnetic material 1440, as shown in FIG. 40(c)). In yet other embodiments, the magnetic material may be disposed on the second electrode (not shown), which is not limited thereto.

Figure 41:
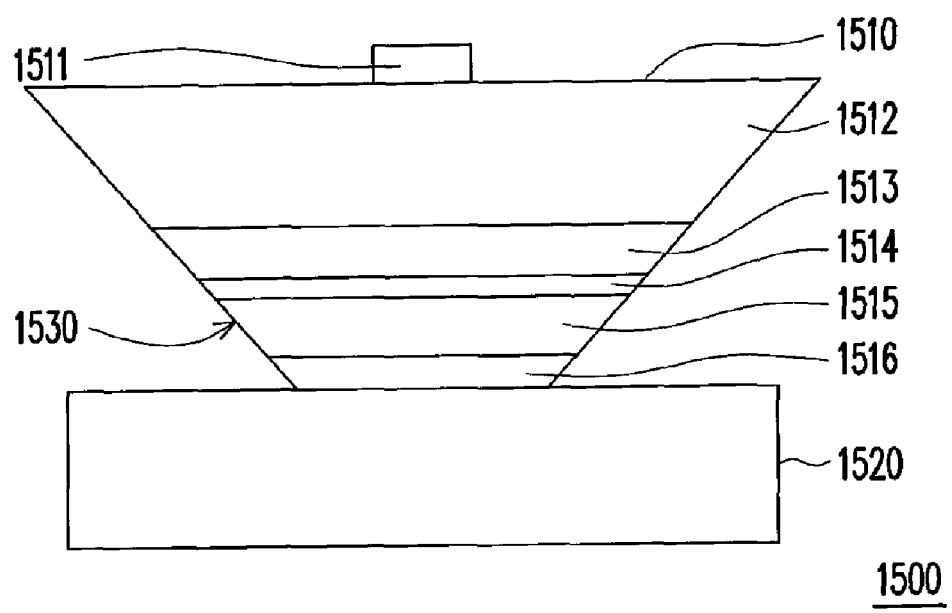
FIG. 41 is a cross-sectional diagram illustrating a structure of a light emitting device according to one embodiment of the present invention.

It should be noted herein that, in one embodiment, the foregoing light emitting stacking layer may be fabricated in a transitive inverted pyramid (TIP) form, so as to enhance the brightness of the light emitting device. FIG. 41 is a cross-sectional diagram illustrating a structure of a light emitting device according to one embodiment of the present invention. Referring to FIG. 41, the light emitting device 1500 of the present embodiment is a flip chip LED having a vertical type structure, which includes a light emitting chip 1510 and a magnetic material 1520. The light emitting chip 1510 includes, from top to bottom, a first electrode 1511, a substrate 1512, a first doped layer 1513, an active layer 1514, a second doped layer 1515, and a second electrode 1516 in which the first doped layer 1513, the active layer 1514, and the second doped layer 1515 form a light emitting stacking layer 1530.

As shown in FIG. 41, the light emitting stacking layer 1530 is fabricated in a transitive inverted pyramid (TIP) form, in which the surface of the light emitting stacking layer 1530 is able to reflect the light emitted from the active layer 1514 and direct the light to the light-out plane of the light emitting device 1500, such that an overall brightness of the light emitting device 1500 is increased.

As mentioned above, a plurality of structures of light emitting chip are used and disposed with a magnetic material, so as to enhance the brightness of the light emitting device. However, in another aspect, the magnetic material may be fabricated into a substrate, a submount, a magnetic film, an electromagnet, a slug, a holder, or a magnetic heat sink, the magnetic material may be ferromagnetic material such as Rb, Ru, Nd, Fe, Pg, Co, Ni, Mn, Cr, Cu, Cr2, Pt, Sm, Sb, Pt, or an alloy thereof, and the surface magnetic force thereof is larger than 0.01 Tesla, and the shape thereof can be a circle or a polygon. Embodiments are given below for illustrating the allocation of the magnetic material and plural light emitting chips.

Figure 42:
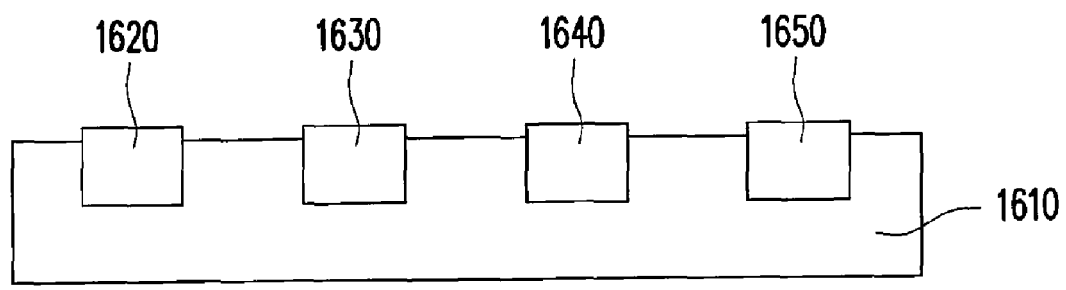
FIG. 42 is a cross-sectional diagram illustrating a structure of a light emitting device according to one embodiment of the present invention.

FIG. 42 is a cross-sectional diagram illustrating a structure of a light emitting device according to one embodiment of the present invention. Referring to FIG. 42, the magnetic material is fabricated into a submount 1610 and plural light emitting chips 1620~1650 are embedded in the submount 1610.

Figure 43:
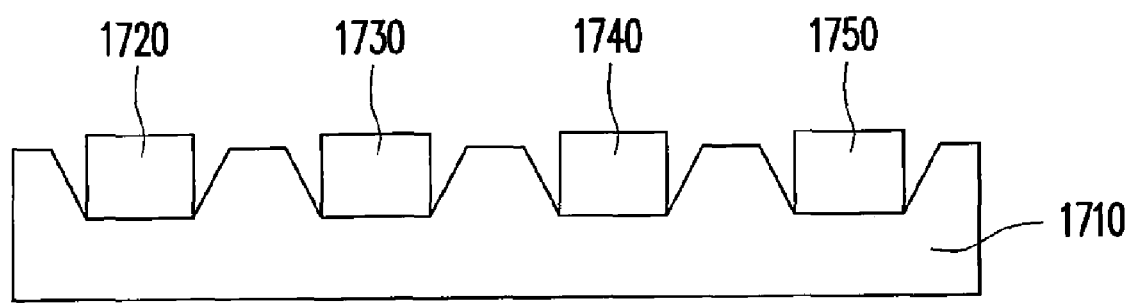
FIG. 43 is a cross-sectional diagram illustrating a structure of a light emitting device according to one embodiment of the present invention.
Figure 44:
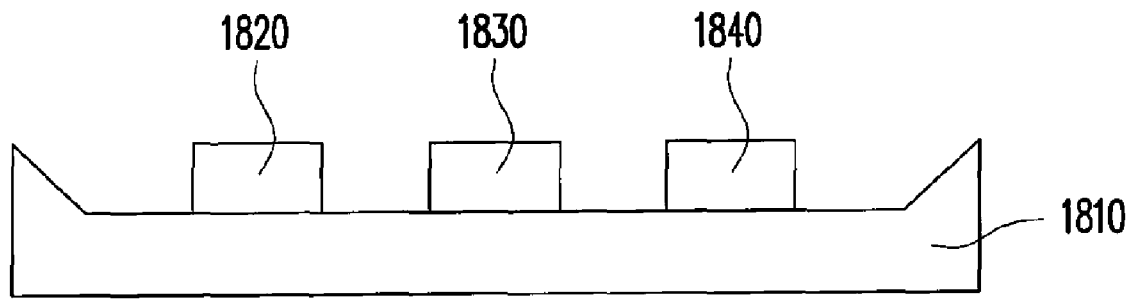
FIG. 44 is a cross-sectional diagram illustrating a structure of a light emitting device according to one embodiment of the present invention.

In other embodiment, the magnetic material may be fabricated with one or a plurality of concaves for disposing the light emitting chips. FIG. 43 and FIG. 44 are cross-sectional diagrams illustrating a structure of a light emitting device according to one embodiment of the present invention. Referring to FIG. 43, the magnetic material is fabricated into a submount 1710 having a plurality of concaves, each of which is disposed with one of the light emitting chips 1720~1750 and has a reflective surface for reflecting light emitted by the corresponding light emitting chip. Referring to FIG. 44, the magnetic material is fabricated into a submount 1810 having only one concave, which is disposed with the light emitting chips 1820~1840 and also has a reflective surface for reflecting light emitted by the light emitting chips 1820~1840. Accordingly, the light emitting efficiency of the light emitting device is enhanced not only by the effect of magnetic force but also by the effect of reflector, such that an overall brightness of the light emitting device is increased.

It should be noted herein that, with the external energy field applied to the light emitting device, not only the current path is changed, but also the homogeneity of the carrier density in the semiconductor is altered. Accordingly, the light emitting device has a higher efficiency for optoelectronic transformation even though the amount of injected current remains unchanged.

Figure 45:
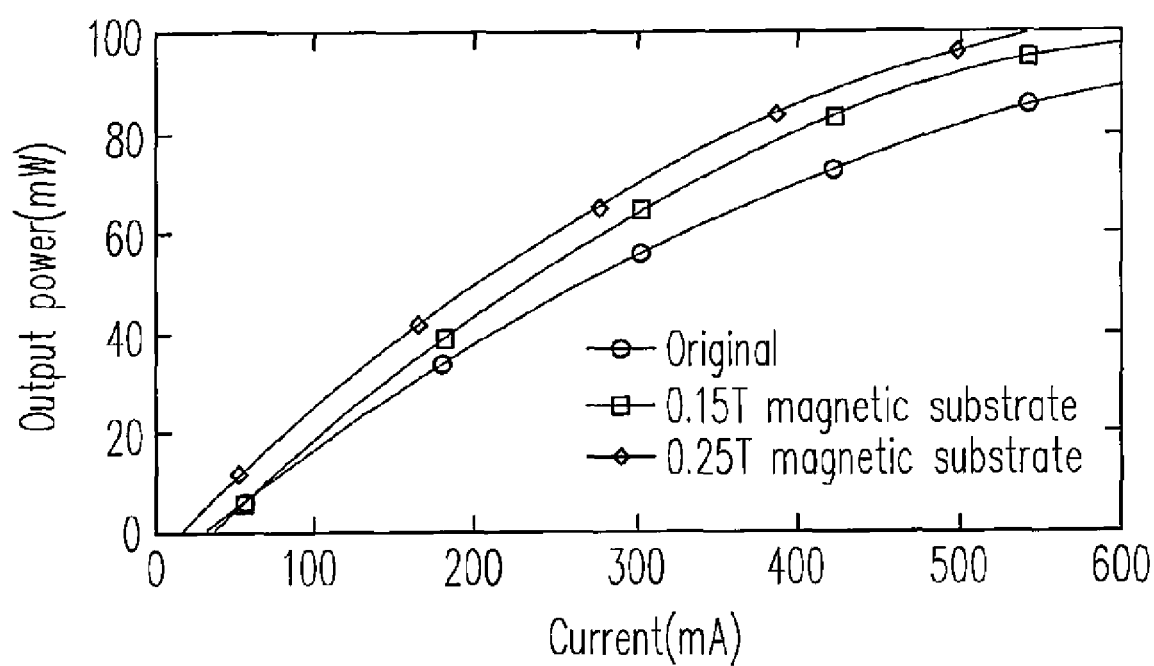
FIG. 45 is a graph showing the output power of the light emitted by the light emitting device having the magnetic substrate according to one embodiment of the present invention.

FIG. 45 is a graph showing the output power of the light emitted by the light emitting device having the magnetic substrate according to one embodiment of the present invention, where x coordinate refers to the current injected into the light emitting device and y coordinate refers to the output power of light emitted by the light emitting device. Referring to FIG. 45, the efficiency of optoelectronic transformation is raised by 0.025 mW/mA and an overall output power of light is enhanced by 15 percent as a 0.15 T magnetic field is added to the light emitting device. On the other hand, the efficiency of optoelectronic transformation is raised by 0.04 mW/mA and an overall output power of light is enhanced by 22.6 percent as a 0.25 T magnetic field is added to the light emitting device. As shown in FIG. 45, apparently, the output power of light is enhanced when the strength of the external magnetic field is increased.

To sum up, the magnetic field may be added to the light emitting device in the manners as described above, so as to enhance the light emitting efficiency and increase the luminance of the light emitting device. Accordingly, the present invention at least has following advantages.

1. With the enhancement of the capability, for spreading the drift current, the distance between the electrodes can be increased, such that the number of electrodes can be decreased and the size of the electrodes can be reduced. Accordingly, the light emitting area can be enlarged so as to enhance the light emitting efficiency of the light emitting device.

2. The amount of the spread drift current is increased, such that the main distribution with the highest current density is moved from the area between the electrodes of the light emitting device to the area under the light-out area so as to enhance current homogeneity. Accordingly, the area with highest efficiency of optoelectronic transformation is no longer blocked by the electrodes so as to enhance the light emitting efficiency of the light emitting device.

What is claimed is:

1. A light emitting device, comprising:
    a light emitting chip, comprising:
        a light emitting stacking layer having a first surface and a second surface opposite to the first surface;
        a first electrode, electrically coupled to the first surface; and
        a second electrode, electrically coupled to the second surface; and
    a magnetic material, coupled to the light emitting chip, having a concave for disposing the light emitting chip, wherein the concave has a reflective surface for reflecting light emitted by the light emitting chip.

2. The light emitting device according to claim 1, wherein the light emitting chip comprises:
    a substrate, coupled to the magnetic material, wherein the light emitting stacking layer is disposed on the substrate.

3. The light emitting device according to claim 2, wherein the light emitting stacking layer comprises:
    a first doped layer;
    a second doped layer, disposed on the substrate and under the first doped layer; and
    an active layer, disposed between the first doped layer and the second doped layer.

4. The light emitting device according to claim 3, wherein the first doped layer and the second doped layer comprise a P doped layer or an N doped layer.

5. The light emitting device according to claim 1, wherein the material of the light emitting stacking layer comprises GaAs, InP, GaN, GaP, AlP, AlAs, InAs, GaSb, InSb, CdS, CdSe, ZnS, or ZnSe.

6. The light emitting device according to claim 2, wherein the material of the substrate comprises Si, SiC, GaN, GaN, GaP, GaAs, sapphire, ZnO, or AlN.

7. The light emitting device according to claim 1, wherein the light emitting chip comprises:
    a substrate, disposed on the light emitting stacking layer, wherein the light emitting stacking layer is coupled to the magnetic material.

8. The light emitting device according to claim 7, wherein the light emitting stacking layer comprises:
    a first doped layer, disposed under the substrate;
    a second doped layer, disposed under the first doped layer and on the magnetic material; and
    an active layer, disposed between the first doped layer and the second doped layer.

9. The light emitting device according to claim 8, wherein the first doped layer and the second doped layer comprise a P doped layer or an N doped layer.

10. The light emitting device according to claim 7, wherein the material of the substrate comprises Si, SiC, GaN, GaN, GaP, GaAs, sapphire, ZnO, or AlN.

11. The light emitting device according to claim 1, wherein the light emitting stacking layer comprises:
    a first doped layer;
    a second doped layer, disposed under the first doped layer; and
    an active layer, disposed between the first doped layer and the second doped layer.

12. The light emitting device according to claim 11, wherein the magnetic material is disposed on the first electrode.

13. The light emitting device according to claim 11, wherein the magnetic material is disposed on the light emitting stacking layer and covers the first electrode.

14. The light emitting device according to claim 11, wherein the magnetic material is disposed on a surface of the light emitting stacking layer uncovered by the first electrode.

15. The light emitting device according to claim 11, wherein the first doped layer and the second doped layer comprise a P doped layer or an N doped layer.

16. The light emitting device according to claim 1, wherein the light emitting chip is coupled with the magnetic material through an epoxy, a metal bonding, a wafer bonding, epitaxy embeding, or a coating process.

17. The light emitting device according to claim 1, wherein the magnetic material is produced as a magnetic film or a magnetic bulk.

18. The light emitting device according to claim 1, wherein the magnetic material comprises Rb, Ru, Tb, Nd, Fe, Pg, Co, Ni, Mn, Cr, Cu, Cr2, Pt, Sm, Sb, or Pt.

19. The light emitting device according to claim 1, wherein the magnetic material comprises one of oxides of Mn, Fe, Co, Cu and V, $Cr_2O_3$, CrS, MnS, MnSe, MnTe, fluorides of Mn, Fe, Co or Ni, chlorides of V, Cr, Fe, Co, Ni and Cu, bromides of Cu, CrSb, MnAs, MnBi, α-Mn, $MnCl_2.4H_2O$, $MnBr_2.4H_2O$, $CuCl_2.2H_2O$, $Co(NH_4)x(SO_4)xCl_2.6H_2O$, $FeCO_3$, and $FeCO_3.2MgCO_3$.

20. The light emitting device according to claim 1, wherein the magnetic material has a surface magnetic force larger than 0.01 Tesla.

21. A light emitting device, comprising:
a light emitting chip, comprising:
a light emitting stacking layer having a first surface and a second surface opposite to the first surface;
a first electrode, electrically coupled to the first surface; and
a second electrode, electrically coupled to the second surface; and
a magnetic material, coupled to the light emitting chip, wherein the magnetic material has a plurality of concaves, each of which is used for disposing one light emitting chip and has a reflective surface for reflecting light emitted by the corresponding light emitting chip.

22. The light emitting device according to claim 21, wherein the light emitting chip further comprises:
a substrate, coupled to the magnetic material, wherein the light emitting stacking layer is disposed on the substrate.

23. The light emitting device according to claim 22, wherein the light emitting stacking layer comprises:
a first doped layer;
a second doped layer, disposed on the substrate and under the first doped layer; and
an active layer, disposed between the first doped layer and the second doped layer.

24. The light emitting device according to claim 23, wherein the first doped layer and the second doped layer comprise a P doped layer or an N doped layer.

25. The light emitting device according to claim 22, wherein the material of the substrate comprises Si, SiC, GaN, GaN, GaP, GaAs, sapphire, ZnO, or AlN.

26. The light emitting device according to claim 21, wherein the material of the light emitting stacking layer comprises GaAs, InP, GaN, GaP, AlP, AlAs, InAs, GaSb, InSb, CdS, CdSe, ZnS, or ZnSe.

27. The light emitting device according to claim 21, wherein the light emitting chip comprises:
a substrate, disposed on the light emitting stacking layer, wherein the light emitting stacking layer is coupled to the magnetic material.

28. The light emitting device according to claim 27, wherein the material of the substrate comprises Si, SiC, GaN, GaN, GaP, GaAs, sapphire, ZnO, or AlN.

29. The light emitting device according to claim 27, wherein the light emitting stacking layer comprises:
a first doped layer, disposed under the substrate;
a second doped layer, disposed under the first doped layer and on the magnetic material; and
an active layer, disposed between the first doped layer and the second doped layer.

30. The light emitting device according to claim 29, wherein the first doped layer and the second doped layer comprise a P doped layer or an N doped layer.

31. The light emitting device according to claim 21, wherein the light emitting stacking layer comprises:
a first doped layer;
a second doped layer, disposed under the first doped layer; and
an active layer, disposed between the first doped layer and the second doped layer.

32. The light emitting device according to claim 31, wherein the magnetic material is disposed on the first electrode.

33. The light emitting device according to claim 31, wherein the magnetic material is disposed on the light emitting stacking layer and covers the first electrode.

34. The light emitting device according to claim 31, wherein the magnetic material is disposed on a surface of the light emitting stacking layer uncovered by the first electrode.

35. The light emitting device according to claim 31, wherein the first doped layer and the second doped layer comprise an P doped layer or an N doped layer.

36. The light emitting device according to claim 21, wherein the light emitting chip is coupled with the magnetic material through an epoxy, a metal bonding, a wafer bonding, epitaxy embeding, or a coating process.

37. The light emitting device according to claim 21, wherein the magnetic material is produced as a magnetic film or a magnetic bulk.

38. The light emitting device according to claim 21, wherein the magnetic material comprises Rb, Ru, Tb, Nd, Fe, Pg, Co, Ni, Mn, Cr, Cu, Cr2, Pt, Sm, Sb, or Pt.

39. The light emitting device according to claim 21, wherein the magnetic material comprises one of oxides of Mn, Fe, Co, Cu and V, $Cr_2O_3$, CrS, MnS, MnSe, MnTe, fluorides of Mn, Fe, Co or Ni, chlorides of V, Cr, Fe, Co, Ni and Cu, bromides of Cu, CrSb, MnAs, MnBi, α-Mn, $MnCl_2.4H_2O$, $MnBr_2.4H_2O$, $CuCl_2.2H_2O$, $Co(NH_4)x(SO_4)xCl_2.6H_2O$, $FeCO_3$, and $FeCO_3.2MgCO_3$.

40. The light emitting device according to claim 21, wherein the magnetic material has a surface magnetic force larger than 0.01 Tesla.

41. A light emitting device, comprising:
a light emitting chip, comprising:
a light emitting stacking layer having a first surface and a second surface opposite to the first surface;
a first electrode, electrically coupled to the first surface; and
a second electrode, electrically coupled to the second surface; and
a magnetic material, coupled to the light emitting chip, wherein the light emitting chips are embedded in the magnetic material.

42. The light emitting device according to claim 41, wherein the light emitting chip further comprises:
a substrate, coupled to the magnetic material, wherein the light emitting stacking layer is disposed on the substrate.

43. The light emitting device according to claim 42, wherein the light emitting stacking layer comprises:
a first doped layer;
a second doped layer, disposed on the substrate and under the first doped layer; and
an active layer, disposed between the first doped layer and the second doped layer.

44. The light emitting device according to claim 43, wherein the first doped layer and the second doped layer comprise a P doped layer or an N doped layer.

45. The light emitting device according to claim 42, wherein the material of the substrate comprises Si, SiC, GaN, GaN, GaP, GaAs, sapphire, ZnO, or AlN.

46. The light emitting device according to claim 41, wherein the material of the light emitting stacking layer comprises GaAs, InP, GaN, GaP, AlP, AlAs, InAs, GaSb, InSb, CdS, CdSe, ZnS, or ZnSe.

47. The light emitting device according to claim 41, wherein the light emitting chip comprises:
a substrate, disposed on the light emitting stacking layer, wherein the light emitting stacking layer is coupled to the magnetic material.

48. The light emitting device according to claim 47, wherein the material of the substrate comprises Si, SiC, GaN, GaN, GaP, GaAs, sapphire, ZnO, or AlN.

49. The light emitting device according to claim 47, wherein the light emitting stacking layer comprises:
a first doped layer, disposed under the substrate;
a second doped layer, disposed under the first doped layer and on the magnetic material; and
an active layer, disposed between the first doped layer and the second doped layer.

50. The light emitting device according to claim 49, wherein the first doped layer and the second doped layer comprise a P doped layer or an N doped layer.

51. The light emitting device according to claim 41, wherein the light emitting stacking layer comprises:
a first doped layer;
a second doped layer, disposed under the first doped layer; and
an active layer, disposed between the first doped layer and the second doped layer.

52. The light emitting device according to claim 51, wherein the magnetic material is disposed on the first electrode.

53. The light emitting device according to claim 51, wherein the magnetic material is disposed on the light emitting stacking layer and covers the first electrode.

54. The light emitting device according to claim 51, wherein the magnetic material is disposed on a surface of the light emitting stacking layer uncovered by the first electrode.

55. The light emitting device according to claim 51, wherein the first doped layer and the second doped layer comprise an P doped layer or an N doped layer.

56. The light emitting device according to claim 41, wherein the light emitting chip is coupled with the magnetic material through an epoxy, a metal bonding, a wafer bonding, epitaxy embedding, or a coating process.

57. The light emitting device according to claim 41, wherein the magnetic material is produced as a magnetic film or a magnetic bulk.

58. The light emitting device according to claim 41, wherein the magnetic material comprises Rb, Ru, Tb, Nd, Fe, Pg, Co, Ni, Mn, Cr, Cu, Cr2, Pt, Sm, Sb, or Pt.

59. The light emitting device according to claim 41, wherein the magnetic material comprises one of oxides of Mn, Fe, Co, Cu and V, $Cr_2O_3$, CrS, MnS, MnSe, MnTe, fluorides of Mn, Fe, Co or Ni, chlorides of V, Cr, Fe, Co, Ni and Cu, bromides of Cu, CrSb, MnAs, MnBi, α-Mn, $MnCl_2.4H_2O$, $MnBr_2.4H_2O$, $CuCl_2.2H_2O$, $Co(NH_4)x(SO_4)$ $xCl_2.6H_2O$, $FeCO_3$, and $FeCO_3.2MgCO_3$.

60. The light emitting device according to claim 41, wherein the magnetic material has a surface magnetic force larger than 0.01 Tesla.

61. A light emitting device, comprising:
a light emitting chip, comprising:
a light emitting stacking layer having a first surface and a second surface opposite to the first surface;
a first electrode, electrically coupled to the first surface; and
a second electrode, electrically coupled to the second surface; and
a magnetic material, coupled to the light emitting chip, wherein the shape of the magnetic material comprises a circle or a polygon.

62. The light emitting device according to claim 61, wherein the light emitting chip further comprises:
a substrate, coupled to the magnetic material, wherein the light emitting stacking layer is disposed on the substrate.

63. The light emitting device according to claim 62, wherein the light emitting stacking layer comprises:
a first doped layer;
a second doped layer, disposed on the substrate and under the first doped layer; and
an active layer, disposed between the first doped layer and the second doped layer.

64. The light emitting device according to claim 63, wherein the first doped layer and the second doped layer comprise a P doped layer or an N doped layer.

65. The light emitting device according to claim 62, wherein the material of the substrate comprises Si, SiC, GaN, GaN, GaP, GaAs, sapphire, ZnO, or AlN.

66. The light emitting device according to claim 61, wherein the material of the light emitting stacking layer comprises GaAs, InP, GaN, GaP, AlP, AlAs, InAs, GaSb, InSb, CdS, CdSe, ZnS, or ZnSe.

67. The light emitting device according to claim 61, wherein the light emitting chip comprises:
a substrate, disposed on the light emitting stacking layer, wherein the light emitting stacking layer is coupled to the magnetic material.

68. The light emitting device according to claim 67, wherein the material of the substrate comprises Si, SiC, GaN, GaN, GaP, GaAs, sapphire, ZnO, or AlN.

69. The light emitting device according to claim 67, wherein the light emitting stacking layer comprises:
a first doped layer, disposed under the substrate;
a second doped layer, disposed under the first doped layer and on the magnetic material; and
an active layer, disposed between the first doped layer and the second doped layer.

70. The light emitting device according to claim 69, wherein the first doped layer and the second doped layer comprise a P doped layer or an N doped layer.

71. The light emitting device according to claim 61, wherein the light emitting stacking layer comprises:
a first doped layer;
a second doped layer, disposed under the first doped layer; and
an active layer, disposed between the first doped layer and the second doped layer.

72. The light emitting device according to claim 71, wherein the magnetic material is disposed on the first electrode.

73. The light emitting device according to claim 71, wherein the magnetic material is disposed on the light emitting stacking layer and covers the first electrode.

74. The light emitting device according to claim 71, wherein the magnetic material is disposed on a surface of the light emitting stacking layer uncovered by the first electrode.

75. The light emitting device according to claim 71, wherein the first doped layer and the second doped layer comprise an P doped layer or an N doped layer.

76. The light emitting device according to claim 61, wherein the light emitting chip is coupled with the magnetic material through an epoxy, a metal bonding, a wafer bonding, epitaxy embeding, or a coating process.

77. The light emitting device according to claim 61, wherein the magnetic material is produced as a magnetic film or a magnetic bulk.

78. The light emitting device according to claim 61, wherein the magnetic material comprises Rb, Ru, Tb, Nd, Fe, Pg, Co, Ni, Mn, Cr, Cu, Cr2, Pt, Sm, Sb, or Pt.

79. The light emitting device according to claim 61, wherein the magnetic material comprises one of oxides of Mn, Fe, Co, Cu and V, $Cr_2O_3$, CrS, MnS, MnSe, MnTe, fluorides of Mn, Fe, Co or Ni, chlorides of V, Cr, Fe, Co, Ni and Cu, bromides of Cu, CrSb, MnAs, MnBi, α-Mn, $MnCl_2.4H_2O$, $MnBr_2.4H_2O$, $CuCl_2.2H_2O$, $Co(NH_4)x(SO_4)xCl_2.6H_2O$, $FeCO_3$, and $FeCO_3.2MgCO_3$.

80. The light emitting device according to claim 61, wherein the magnetic material has a surface magnetic force larger than 0.01 Tesla.

81. A light emitting device, comprising:
a light emitting chip, comprising:
a light emitting stacking layer having a first surface and a second surface opposite to the first surface;
a first electrode, electrically coupled to the first surface; and
a second electrode, electrically coupled to the second surface; and
a magnetic material, coupled to the light emitting chip, wherein the magnetic material comprises a substrate, a submount, an electromagnet, a slug, a holder, or a magnetic heat sink.

82. The light emitting device according to claim 81, wherein the light emitting chip further comprises:
a substrate, coupled to the magnetic material, wherein the light emitting stacking layer is disposed on the substrate.

83. The light emitting device according to claim 82, wherein the light emitting stacking layer comprises:
a first doped layer;
a second doped layer, disposed on the substrate and under the first doped layer; and
an active layer, disposed between the first doped layer and the second doped layer.

84. The light emitting device according to claim 83, wherein the first doped layer and the second doped layer comprise a P doped layer or an N doped layer.

85. The light emitting device according to claim 82, wherein the material of the substrate comprises Si, SiC, GaN, GaN, GaP, GaAs, sapphire, ZnO, or AlN.

86. The light emitting device according to claim 81, wherein the material of the light emitting stacking layer comprises GaAs, InP, GaN, GaP, AlP, AlAs, InAs, GaSb, InSb, CdS, CdSe, ZnS, or ZnSe.

87. The light emitting device according to claim 81, wherein the light emitting chip comprises:
a substrate, disposed on the light emitting stacking layer, wherein the light emitting stacking layer is coupled to the magnetic material.

88. The light emitting device according to claim 87, wherein the material of the substrate comprises Si, SiC, GaN, GaN, GaP, GaAs, sapphire, ZnO, or AlN.

89. The light emitting device according to claim 87, wherein the light emitting stacking layer comprises:
a first doped layer, disposed under the substrate;
a second doped layer, disposed under the first doped layer and on the magnetic material; and
an active layer, disposed between the first doped layer and the second doped layer.

90. The light emitting device according to claim 89, wherein the first doped layer and the second doped layer comprise a P doped layer or an N doped layer.

91. The light emitting device according to claim 81, wherein the light emitting stacking layer comprises:
a first doped layer;
a second doped layer, disposed under the first doped layer; and
an active layer, disposed between the first doped layer and the second doped layer.

92. The light emitting device according to claim 91, wherein the magnetic material is disposed on the first electrode.

93. The light emitting device according to claim 91, wherein the magnetic material is disposed on the light emitting stacking layer and covers the first electrode.

94. The light emitting device according to claim 91, wherein the magnetic material is disposed on a surface of the light emitting stacking layer uncovered by the first electrode.

95. The light emitting device according to claim 91, wherein the first doped layer and the second doped layer comprise an P doped layer or an N doped layer.

96. The light emitting device according to claim 81, wherein the light emitting chip is coupled with the magnetic material through an epoxy, a metal bonding, a wafer bonding, epitaxy embeding, or a coating process.

97. The light emitting device according to claim 81, wherein the magnetic material is produced as a magnetic film or a magnetic bulk.

98. The light emitting device according to claim 81, wherein the magnetic material comprises Rb, Ru, Tb, Nd, Fe, Pg, Co, Ni, Mn, Cr, Cu, Cr2, Pt, Sm, Sb, or Pt.

99. The light emitting device according to claim 81, wherein the magnetic material comprises one of oxides of Mn, Fe, Co, Cu and V, $Cr_2O_3$, CrS, MnS, MnSe, MnTe, fluorides of Mn, Fe, Co or Ni, chlorides of V, Cr, Fe, Co, Ni and Cu, bromides of Cu, CrSb, MnAs, MnBi, α-Mn, $MnCl_2.4H_2O$, $MnBr_2.4H_2O$, $CuCl_2.2H_2O$, $Co(NH_4)x(SO_4)xCl_2.6H_2O$, $FeCO_3$, and $FeCO_3.2MgCO_3$.

100. The light emitting device according to claim 81, wherein the magnetic material has a surface magnetic force larger than 0.01 Tesla.

\* \* \* \* \*